US010644165B2

(12) United States Patent
Kobayashi et al.

(10) Patent No.: US 10,644,165 B2
(45) Date of Patent: May 5, 2020

(54) THIN-FILM TRANSISTOR, METHOD OF FABRICATING THIN-FILM TRANSISTOR, AND DISPLAY DEVICE

(71) Applicant: JOLED INC., Tokyo (JP)

(72) Inventors: Emi Kobayashi, Osaka (JP); Arinobu Kanegae, Osaka (JP); Yusuke Fukui, Saitama (JP)

(73) Assignee: JOLED INC., Tokyo (JP)

( * ) Notice: Subject to any disclaimer, the term of this patent is extended or adjusted under 35 U.S.C. 154(b) by 13 days.

(21) Appl. No.: 16/028,619

(22) Filed: Jul. 6, 2018

(65) Prior Publication Data

US 2018/0315858 A1  Nov. 1, 2018

Related U.S. Application Data

(62) Division of application No. 14/956,894, filed on Dec. 2, 2015, now Pat. No. 10,050,150.

(30) Foreign Application Priority Data

Dec. 3, 2014  (JP) ................................ 2014-245398

(51) Int. Cl.
*H01L 29/786* (2006.01)
*H01L 29/45* (2006.01)
*H01L 29/66* (2006.01)

(52) U.S. Cl.
CPC .......... *H01L 29/7869* (2013.01); *H01L 29/45* (2013.01); *H01L 29/66969* (2013.01); *H01L 29/78606* (2013.01); *H01L 29/78618* (2013.01); *H01L 29/78693* (2013.01)

(58) Field of Classification Search
None
See application file for complete search history.

(56) References Cited

U.S. PATENT DOCUMENTS

| 8,384,076 B2 | 2/2013 | Park et al. |
| 2009/0283763 A1 | 11/2009 | Park et al. |
| 2010/0213460 A1 | 8/2010 | Kondo et al. |
| 2010/0224873 A1 | 9/2010 | Sakata et al. |

(Continued)

FOREIGN PATENT DOCUMENTS

| JP | 2001-262336 | 9/2001 |
| JP | 2009-278115 | 11/2009 |

(Continued)

OTHER PUBLICATIONS

U.S. Appl. No. 14/956,780 to Arinobu Kanegae et al., which was filed Dec. 2, 2015.

(Continued)

*Primary Examiner* — Robert K Carpenter
(74) *Attorney, Agent, or Firm* — Greenblum & Bernstein, P.L.C.

(57) ABSTRACT

A method of fabricating a thin-film transistor is provided. In the method, an oxide semiconductor layer is formed above a substrate. A gate insulating layer is formed above the oxide semiconductor layer. A gate electrode is formed above the gate insulating layer. A metal oxide layer is formed on the oxide semiconductor layer by reactive sputtering to reduce a resistance of the oxide semiconductor layer in a region in contact with the metal oxide layer.

16 Claims, 14 Drawing Sheets

(56) References Cited

U.S. PATENT DOCUMENTS

| | | |
|---|---|---|
| 2011/0240998 A1 | 10/2011 | Morosawa et al. |
| 2011/0248270 A1 | 10/2011 | Fukumoto et al. |
| 2011/0315980 A1* | 12/2011 | Kim .......... H01L 29/7869 257/43 |
| 2012/0001167 A1 | 1/2012 | Morosawa |
| 2012/0218495 A1 | 8/2012 | Oshima |
| 2012/0315730 A1 | 12/2012 | Koezuka et al. |
| 2013/0299826 A1 | 11/2013 | Sakata et al. |
| 2014/0203859 A1 | 7/2014 | Kato et al. |
| 2014/0291675 A1 | 10/2014 | Sakata et al. |
| 2015/0137119 A1 | 5/2015 | Sakata et al. |
| 2015/0179809 A1* | 6/2015 | Liu .......... H01L 29/78606 257/72 |
| 2016/0163873 A1 | 6/2016 | Koezuka et al. |
| 2016/0163878 A1 | 6/2016 | Kanegae et al. |
| 2016/0204269 A1 | 7/2016 | Sakata et al. |
| 2017/0033232 A1 | 2/2017 | Sakata et al. |
| 2018/0145180 A1 | 5/2018 | Koezuka et al. |
| 2018/0286986 A1 | 10/2018 | Sakata et al. |

FOREIGN PATENT DOCUMENTS

| | | |
|---|---|---|
| JP | 2010-232647 | 10/2010 |
| JP | 2011-228622 | 11/2011 |
| JP | 2012-015436 | 1/2012 |
| JP | 2013-016782 | 1/2013 |

OTHER PUBLICATIONS

Office Action from Japan Patent Office (JPO) in Japanese Patent Appl. No. 2014-245398, dated Aug. 21, 2018.

Office Action from Japan Patent Office (JPO) in Japanese Patent Appl. No. 2014-245398, dated Dec. 25, 2018.

\* cited by examiner (a)

(b)

(c)

(f)

(g)

THIN-FILM TRANSISTOR, METHOD OF FABRICATING THIN-FILM TRANSISTOR, AND DISPLAY DEVICE

CROSS REFERENCE TO RELATED APPLICATION

The present application is a Divisional of U.S. patent application Ser. No. 14/956,894, filed on Dec. 2, 2015, which claims priority of Japanese Patent Application No. 2014-245398 filed on Dec. 3, 2014. The entire disclosure of each of the above-identified applications, including the specifications, drawings and claims, is incorporated herein by reference in its entirety.

FIELD

The present invention relates to a thin-film transistor, a method of fabricating the thin-film transistor, and a display device including the thin-film transistor.

BACKGROUND

Thin-film semiconductor devices such as thin-film transistors (TFTs) are conventionally used in active-matrix display devices such as liquid crystal display devices, as well as in solid state imaging devices such as digital cameras. In display devices, a TFT is used, for example, as a switching element for selecting a pixel, a driver transistor for driving a pixel, or as a driver external to the display region.

For example, an organic electroluminescent (EL) display including organic EL elements utilizing an organic light-emitting material differs from a voltage-driven liquid crystal display in that it is a current-driven display device. Therefore, development of a better performing TFT is rapidly progressing.

Recent years have seen active development of a TFT using an oxide semiconductor, a representative example of which is IGZO (In—Ga—Zn—O) (for example, see Patent Literature (PI) 1 and 2). Structures of TFTs using an oxide semiconductor include a bottom-gate structure and a top-gate structure. Top-gate oxide semiconductor TFTs are capable of reducing parasitic capacitance between the gate electrode and the source and drain electrodes, making them high-performing TFTs.

CITATION LIST

Patent Literature

[PTL 1] Japanese Unexamined Patent Application Publication No. 2009-278115
[PTL 2] Japanese Unexamined Patent Application Publication No. 2011-228622

SUMMARY

Technical Problem

The semiconductor layer of a top-gate TFT has a region not covered by the gate electrode (known as the offset region). In order for a sufficiently large drain current to flow, the resistance of the offset region needs to be reduced.

In view of this, an object of the present invention is to provide a thin-film transistor capable of obtaining better transistor characteristics, a method of fabricating the thin-film transistor, and a display device including the thin-film transistor.

Solution to Problem

In order to achieve the above object, according to one aspect of the present invention, a thin-film transistor includes: an oxide semiconductor layer having a channel region, a source region, and a drain region, the source region and the drain region each having a resistivity lower than a resistivity of the channel region; a gate insulating layer disposed above the oxide semiconductor layer; a gate electrode disposed at a position that is above the gate insulating layer and opposing the channel region; and a metal oxide layer disposed on the oxide semiconductor layer and in contact with the source region and the drain region. The metal oxide layer includes, as a main component, an oxide of a second metal whose bond dissociation energy with oxygen is greater than a bond dissociation energy with oxygen of a first metal included in the oxide semiconductor layer. A first concentration ratio of oxygen to the second metal in an interface layer between the metal oxide layer and the oxide semiconductor layer is greater than a second concentration ratio of oxygen to the second metal in a bulk layer of the metal oxide layer.

Advantageous Effects

According to the present invention, a thin-film transistor capable of obtaining better transistor characteristics, a method of fabricating the thin-film transistor, and a display device including the thin-film transistor can be provided.

BRIEF DESCRIPTION OF DRAWINGS

These and other objects, advantages and features of the invention will become apparent from the following description thereof taken in conjunction with the accompanying drawings that illustrate a specific embodiment of the present invention.

Figure 1:
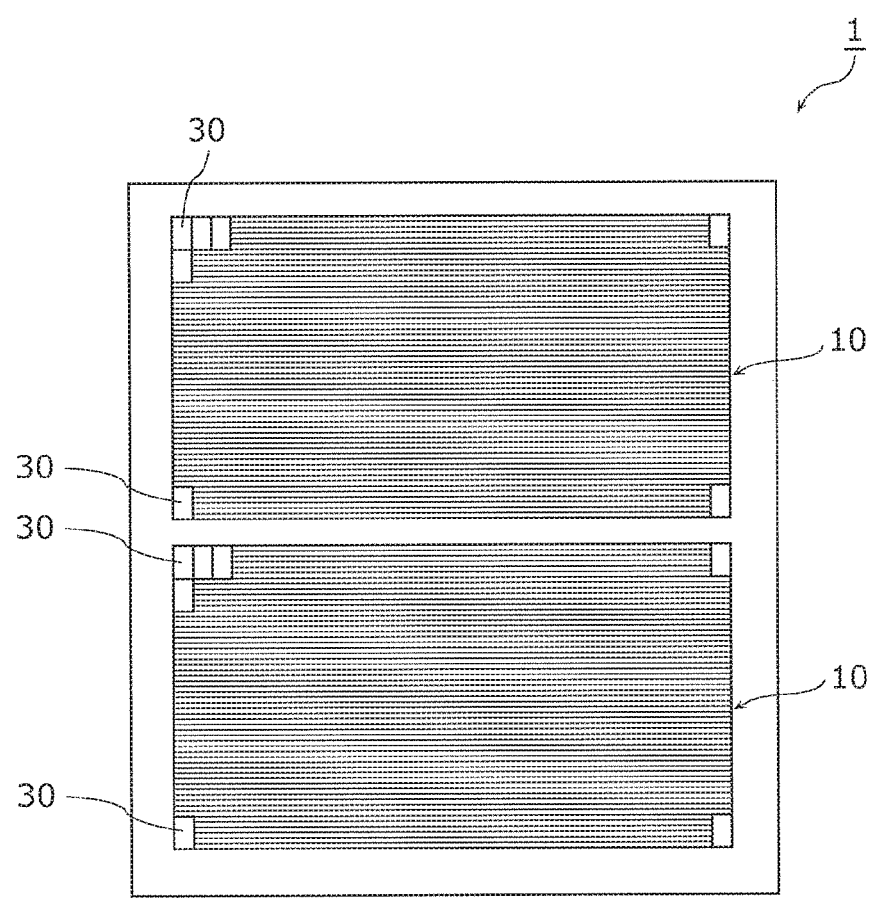
FIG. 1 illustrates the configuration of a thin-film semiconductor array substrate according to an embodiment.

DESCRIPTION OF EMBODIMENT (Outline of Present Invention)

In order to solve the above-described problem, according to one aspect of the present invention, a thin-film transistor includes: an oxide semiconductor layer having a channel region, a source region, and a drain region, the source region and the drain region each having a resistivity lower than a resistivity of the channel region; a gate insulating layer disposed above the oxide semiconductor layer; a gate electrode disposed at a position that is above the gate insulating layer and opposing the channel region; and a metal oxide layer disposed on the oxide semiconductor layer and in contact with the source region and the drain region. The metal oxide layer includes, as a main component, an oxide of a second metal whose bond dissociation energy with oxygen is greater than a bond dissociation energy with oxygen of a first metal included in the oxide semiconductor layer. A first concentration ratio of oxygen to the second metal in an interface layer between the metal oxide layer and the oxide semiconductor layer is greater than a second concentration ratio of oxygen to the second metal in a bulk layer of the metal oxide layer.

With this, since the bond dissociation energy with oxygen of the second metal is greater than the bond dissociation energy with oxygen of the first metal, when the metal oxide layer and the oxide semiconductor layer come in contact, the oxygen in the oxide semiconductor layer is drawn out by the metal oxide layer. As such, oxygen deficiencies generate in the source and drain regions of the oxide semiconductor layer in contact with the metal oxide layer, and the resistance of the source and drain regions can be reduced. Thus, parasitic capacitance between the gate electrode and the source and drain regions can be reduced. Moreover, the parasitic resistance from the source and drain regions to the channel region can be reduced, and even better transistor characteristics can be achieved.

Moreover, according to one aspect of the present invention, a thin-film transistor may include: an oxide semiconductor layer having a channel region, a source region, and a drain region, the source region and the drain region each having a resistivity lower than a resistivity of the channel region; a gate insulating layer disposed above the oxide semiconductor layer; a gate electrode disposed at a position that is above the gate insulating layer and opposing the channel region; and a metal oxide layer disposed on the oxide semiconductor layer and in contact with the source region and the drain region. The metal oxide layer may include, as a main component, an oxide of a second metal whose bond dissociation energy with oxygen is greater than a bond dissociation energy with oxygen of a first metal Included in the oxide semiconductor layer. A stacked structure including the metal oxide layer and the oxide semiconductor layer may include a region whose concentration ratio of oxygen to the second metal is greater than a concentration ratio of oxygen to the second metal in a bulk layer of the metal oxide layer.

With this, since the resistance of the source and drain regions can be reduced, parasitic capacitance between the gate electrode and the source and drain regions can be reduced. Moreover, the parasitic resistance from the source and drain regions to the channel region can be reduced, and even better transistor characteristics can be achieved.

Moreover, for example, the second metal may be aluminum, and the first concentration ratio may be 0.6 or less.

With this, an aluminum oxide whose proportion of oxygen is low and proportion of aluminum is high—in other words, an aluminum-rich aluminum oxide—can be formed as the interface layer. As such, since the interface layer has an aluminum concentration sufficient enough to draw oxygen from the oxide semiconductor layer, the resistance of the source and drain regions of the oxide semiconductor layer can be sufficiently reduced.

Moreover, for example, the metal oxide layer may have a film thickness of 10 nm or more.

With this, for example, by using a large substrate, even if the film thickness of the metal oxide were uneven, the metal oxide is of a thickness sufficient enough to draw oxygen from the oxide semiconductor layer. Thus, the resistance of the source and drain regions of the oxide semiconductor layer can be sufficiently reduced.

Moreover, for example, the second metal may be aluminum, and the metal oxide layer may have a film density of 2.7 g/cm$^3$ or less.

Note that the film density of a typical aluminum oxide film having a low ability to reduce resistance is approximately 3.4 g/cm$^3$. The thin-film transistor according to the present aspect includes a sparse metal oxide, and therefore can effectively draw oxygen from the oxide semiconductor layer. Thus, the resistance of the source and drain regions of the oxide semiconductor layer can be sufficiently reduced.

Moreover, for example, the first metal may be one of indium, gallium, and zinc.

With this, a thin-film transistor having a high carrier mobility and suitable for large-screen, high-definition display devices.

Moreover, for example, side surfaces of the gate electrode, the gate insulating layer, and the channel region may be flush with one another.

With this, since the gate electrode, the gate insulating layer, and the channel region are formed in a self-aligned fashion, a mask alignment process, for example, can be eliminated, and good transistor characteristics with low variations can be achieved.

Moreover, for example, according to one aspect of the present invention, a display device includes the above-described thin-film transistor.

Moreover, for example, according to one aspect of the present invention, a method of fabricating a thin-film transistor may include: forming an oxide semiconductor layer above a substrate; forming a gate insulating layer above the oxide semiconductor layer; forming a gate electrode above the gate insulating layer; and forming a metal oxide layer on the oxide semiconductor layer by reactive sputtering to reduce a resistance of the oxide semiconductor layer in a region in contact with the metal oxide layer.

With this, since the metal oxide layer is formed by reactive sputtering, in-plane uniformity of film properties and film thickness and can be improved. Since the in-plane uniformity of the film properties and the film thickness is favorable, the ability of the metal oxide layer to reduce resistance can be uniform in-plane as well. As such, a thin-film transistor having better transistor characteristics can be fabricated since in-surface variations can be inhibited and the resistance of the oxide semiconductor layer can be reduced.

Moreover, for example, in the forming of a metal oxide layer, the metal oxide layer may be formed by reactive sputtering using, as a target, a second metal whose bond dissociation energy with oxygen is greater than a bond dissociation energy with oxygen of a first metal included in the oxide semiconductor layer, and a first concentration ratio of oxygen to the second metal in an interface layer between the metal oxide layer and the oxide semiconductor layer may be greater than a second concentration ratio of oxygen to the second metal in a bulk layer of the metal oxide layer.

With this, since the bond dissociation energy with oxygen of the second metal is greater than the bond dissociation energy with oxygen of the first metal, when the metal oxide layer and the oxide semiconductor layer come in contact, the oxygen in the oxide semiconductor layer is drawn out by the metal oxide layer. As such, oxygen deficiencies generate in a predetermined region of the oxide semiconductor layer in contact with the metal oxide layer, whereby the resistance of the region decreases. Thus, parasitic capacitance between the gate electrode and the source and drain regions can be reduced. Moreover, the parasitic resistance from the source and drain regions to the channel region can be reduced. As such, a thin-film transistor having better transistor characteristics can be fabricated.

Moreover, for example, in the forming of a metal oxide layer, the reactive sputtering may be performed while the substrate and the target are offset from one another.

With this, since the substrate and the target are offset from one another, a metal oxide layer having a high ability to reduce resistance can be easily formed.

Moreover, for example, according to one aspect of the present invention, a method of fabricating a thin-film transistor may include: forming an oxide semiconductor layer above a substrate; forming a gate insulating layer above the oxide semiconductor layer; exposing the oxide semiconductor layer and forming a gate electrode above the gate insulating layer; and forming, by reactive sputtering, a metal oxide layer in direct contact with an exposed portion of the oxide semiconductor layer.

By forming the metal oxide layer by reactive sputtering, in-plane uniformity of film properties and film thickness and can be improved. Since the in-plane uniformity of the film properties and the film thickness is favorable, the ability of the metal oxide layer to reduce resistance can be uniform in-plane as well. As such, a thin-film transistor having better transistor characteristics can be fabricated since in-surface variations can be inhibited and the resistance of the oxide semiconductor layer can be reduced.

Hereinafter, an embodiment will be described in detail with reference to the Drawings.

The embodiment described below shows a general or specific example. The numerical values, shapes, materials, elements, the arrangement and connection of the elements, steps, the processing order of the steps, etc., shown in the following embodiment are mere examples, and therefore do not limit the scope of the Claims. Therefore, among the elements in the following embodiments, those not recited in any one of the independent claims are described as arbitrary structural elements.

Embodiment (1. Organic EL Display Device)

Figure 2:
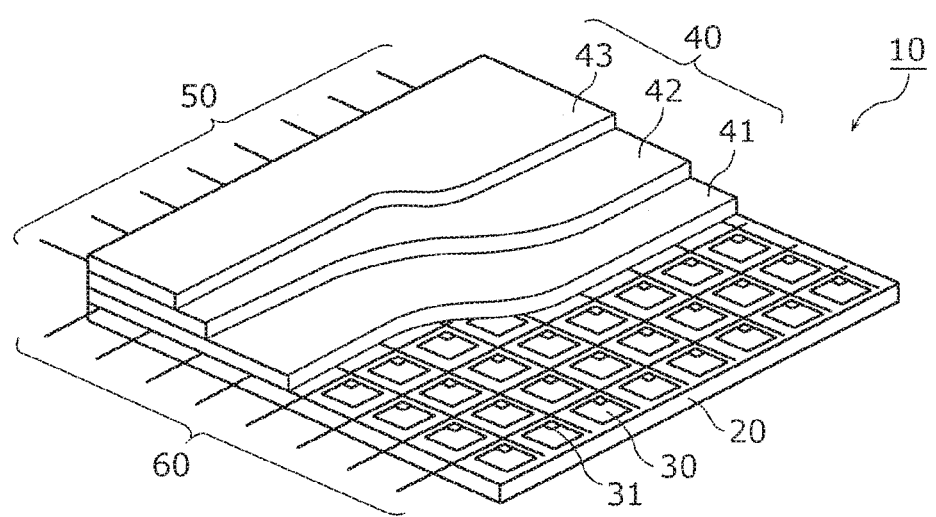
FIG. 2 is a cut-out perspective view of an organic EL display device according to an embodiment.
Figure 3:
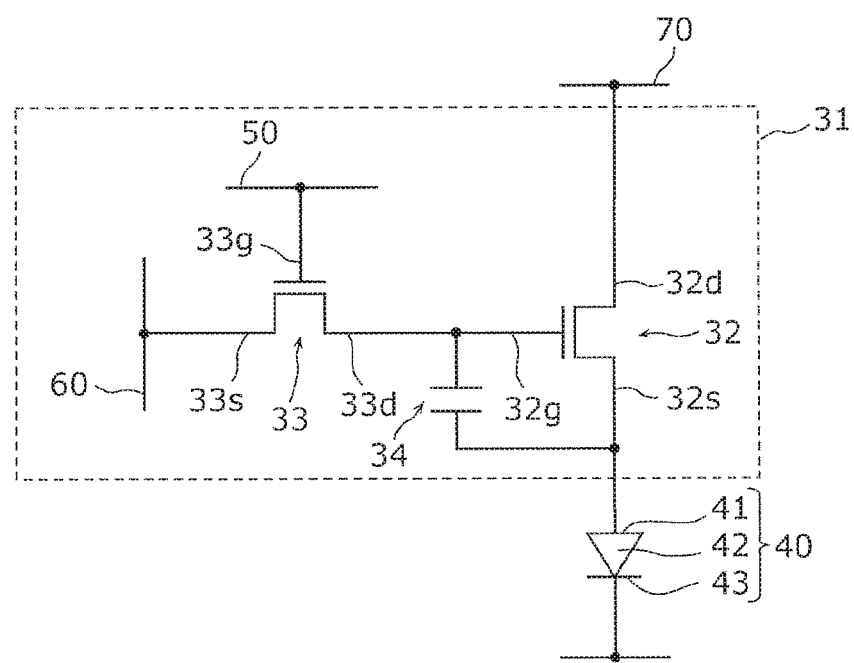
FIG. 3 is a circuit diagram of a pixel circuit in an organic EL display device according to an embodiment.

First, the configuration of an organic EL display device according to the present embodiment will be described with reference to FIG. 1 through FIG. 3. Note that FIG. 1 illustrates the configuration of a thin-film semiconductor array substrate 1 according to the present embodiment. FIG. 2 is a cut-out perspective view of an organic EL display device 10 according to the present embodiment. FIG. 3 is a circuit diagram of a pixel circuit 31 in the organic EL display device 10 according to the present embodiment.

First, the thin-film semiconductor array substrate 1 includes a plurality (two in FIG. 1) of organic EL display devices 10, as illustrated in FIG. 1. Moreover, each of the plurality of organic EL display devices 10 includes a stacked structure of: a TFT substrate (TFT array substrate) 20 in which plural thin-film transistors are disposed; and organic EL elements (light-emitting units) 40 each including an anode 41 which is a lower electrode, an EL layer 42 which is a light-emitting layer including an organic material, and a cathode 43 which is a transparent upper electrode, as illustrated in FIG. 2.

A plurality of pixels 30 are arranged in a matrix in the TFT substrate 20, and the pixel circuit 31 is included in each pixel 30.

Each of the organic EL elements 40 is formed corresponding to a different one of the pixels 30, and control of the light emission of the organic EL element 40 is performed according to the pixel circuit 31 provided in the corresponding pixel 30. The organic EL elements 40 are formed on an interlayer insulating film (planarizing layer) formed to cover the thin-film transistors.

Moreover, the organic EL elements 40 have a configuration in which the EL layer 42 is disposed between the anode 41 and the cathode 43. Furthermore, a hole transport layer is formed stacked between the anode 41 and the EL layer 42, and an electron transport layer is formed stacked between the EL layer 42 and the cathode 43. Note that other organic function layers (a hole injection layer, an electron injection layer, etc.) may be formed between the anode 41 and the cathode 43.

The anode 41 may include, for example, a conductive metal such as molybdenum, aluminum, gold, silver, copper or an alloy thereof; an organic conductive material such as PEDOT:PSS; zinc oxide; or zinc-added indium oxide. The anode 41 is formed by, for example, a vacuum evaporation method, electron beam evaporation method, RF sputtering method, or printing method.

The EL layer 42 is formed on the anode 41 in the bank opening (not illustrated in the Drawings) on a per pixel 30 basis or on a per line basis. The EL layer 42 may include, for example, Alq3(tris(8-hydroxyquinoline) aluminum). Moreover, for example, the hole injection layer may include copper phthalocyanine, the hole transport layer may include α-NPD(Bis[N-(1-Napthyl)-N-Phenyl]benzidine), the electron transport layer may include an oxazole derivative, and the electron injection layer may include Alq3. Note that these materials are merely examples, and the above layers may include other materials.

The cathode 43 may include, for example, ITO, $SnO_2$, $In_2O_3$, ZnO, or a combination thereof.

Each pixel 30 is driven by its corresponding pixel circuit 31. Moreover, in the TFT substrate 20, a plurality of gate lines (scanning lines) 50 are disposed along the row direction of the pixels 30, a plurality of source lines (signal lines) 60 are disposed along the column direction of the pixels 30 to cross with the gate lines 50, and a plurality of power supply lines (not illustrated in FIG. 1) are disposed parallel to the source lines 60. The pixels 30 are partitioned from one another by the crossing gate lines 50 and source lines 60.

The gate lines 50 are connected, on a per-row basis, to the gate electrode of the thin-film transistors operating as switching elements included in the respective pixel circuits 31. The source lines 60 are connected, on a per-column basis, to the source electrode of the thin-film transistors operating as switching elements included in the respective pixel circuits 31. The power supply lines are connected, on a per-column basis, to the drain electrode of the thin-film transistors operating as switching elements included in the respective pixel circuits 31.

Here, the circuit configuration of the pixel circuit 31 in each pixel 30 will be described with reference to FIG. 3. FIG. 3 is a circuit diagram of a pixel circuit 31 in the organic EL display device 10 according to the present embodiment.

As illustrated in FIG. 3, the pixel circuit 31 includes a thin-film transistor 32 that operates as a driver element, a thin-film transistor 33 that operates as a switching element, and a capacitor 34 that stores data to be displayed by the corresponding pixel 30. In the present embodiment, the thin-film transistor 32 is a driver transistor for driving the organic EL elements 40, and the thin-film transistor 33 is a switching transistor for selecting the pixel 30.

The thin-film transistor 32 includes: a gate electrode 32g connected to a drain electrode 33d of the thin-film transistor 33 and one end of the capacitor 34; a drain electrode 32d connected to the power supply line 70; a source electrode 32s connected to the other end of capacitor 34 and the anode 41 of the organic EL element 40; and a semiconductor film (not illustrated in the Drawings). The thin-film transistor 32 supplies current corresponding to data voltage held in the capacitor 34 from the power supply line 70 to the anode 41 of the organic EL elements 40 via the source electrode 32s. With this, in the organic EL elements 40, drive current flows from the anode 41 to the cathode 43 whereby the EL layer 42 emits light.

The thin-film transistor 33 includes: a gate electrode 33g connected to the gate line 50; a source electrode 33s connected to the source line 60; a drain electrode 33d connected to one end of the capacitor 34 and the gate electrode 32g of the thin-film transistor 32; and a semiconductor film (not illustrated in the Drawings). When a predetermined voltage is applied to the gate line 50 and the source line 60 connected to the thin-film transistor 33, the voltage applied to the source line 60 is held as data voltage in the capacitor 34.

Note that the organic EL display device 10 having the above-described configuration uses the active-matrix system in which display control is performed for each pixel 30 located at the cross-point between a gate line 50 and a source line 60. With this, the thin-film transistors 32 and 33 of each pixel 30 (of each subpixel) cause the corresponding organic EL element 40 to selectively emit light, whereby a desired image is displayed.

Note that in FIG. 3, the two thin-film transistors 32 and 33 and the one capacitor 34 are provided as the pixel circuit 31—that is to say, the pixel circuit 31 is exemplified as what is known as a 2Tr1C—but the pixel circuit 31 is not limited to this example. For example, the pixel circuit 31 may further include, for example, a transistor for correcting the threshold voltage of the transistor.

(2. TFT)

Figure 4A:
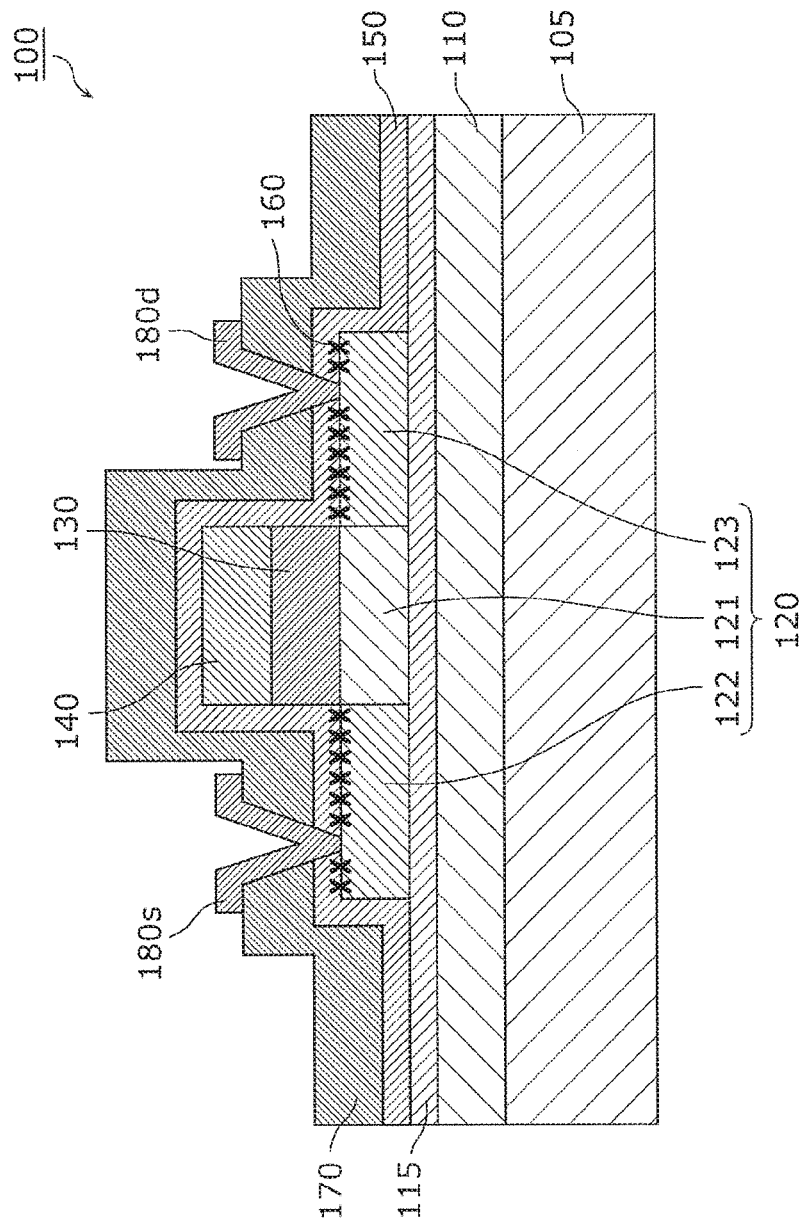
FIG. 4A is a diagram of a cross section of a thin-film transistor according to an embodiment.
Figure 4B:
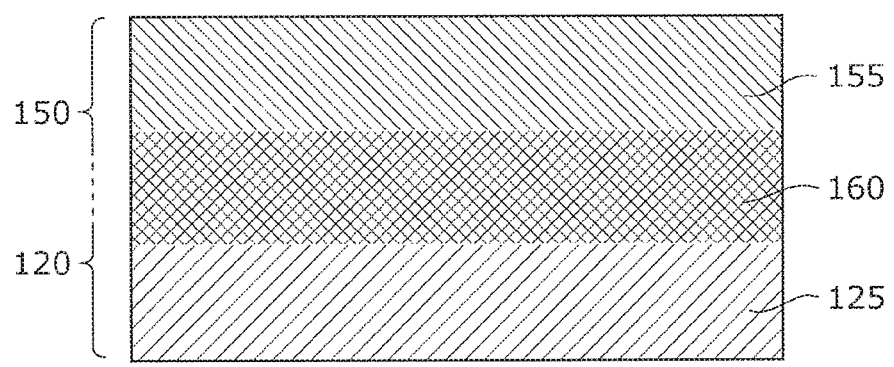
FIG. 4B is a diagram of a cross section of an interface layer between an oxide semiconductor layer and a metal oxide layer of a thin-film transistor according to an embodiment.

Hereinafter, the thin-film transistor formed on the TFT substrate 20 according to the present embodiment will be described with reference to FIG. 4A and FIG. 4B. Note that FIG. 4A is a diagram of a cross section of the thin-film transistor 100 according to the present embodiment. FIG. 4B is a diagram of a cross section of the oxide semiconductor layer 120, the metal oxide layer 150, and the interface layer 160 of the thin-film transistor 100 according to the present embodiment. More specifically, FIG. 4B illustrates the stacked structure including the oxide semiconductor layer 120 and the metal oxide layer 150.

The thin-film transistor 100 according to the present embodiment is a top-gate TFT. The thin-film transistor 100 is, for example, the thin-film transistor 32 illustrated in FIG. 3. In other words, the thin-film transistor 100 can be used as a driver transistor. More specifically, when the thin-film transistor 100 is the thin-film transistor 32 (a driver transistor), the gate electrode 140 corresponds to the gate electrode 32g, the source electrode 180s corresponds to the source electrode 32s, and the drain electrode 180d corresponds to the drain electrode 32d.

Note that the thin-film transistor 100 may be, for example, the thin-film transistor 33 illustrated in FIG. 3. In other words, the thin-film transistor 100 can be used as a switching transistor.

As illustrated in FIG. 4A, the thin-film transistor 100 includes a support substrate 105, a flexible substrate 110, an undercoat layer 115, the oxide semiconductor layer 120, a gate insulating layer 130, the gate electrode 140, the metal oxide layer 150, an interlayer insulating layer 170, the drain electrode 180d, and the source electrode 180s.

Moreover, as illustrated in FIG. 4A, the thin-film transistor 100 includes the interface layer 160 disposed between the oxide semiconductor layer 120 and the metal oxide layer 150. In the present embodiment, the interface layer 160 is disposed at the interface between (i) the source region 122 and drain region 123 of the oxide semiconductor layer 120 and (ii) the metal oxide layer 150.

Note that in the following description, "above" relative to the flexible substrate 110 refers to the side of the flexible substrate 110 that the undercoat layer 115 is formed on and, more specifically, means the upward direction in which the layers are stacked. Moreover, "below" relative to the flexible substrate 110 refers to the side of the flexible substrate 100 opposite the side that the undercoat layer 115 is formed on and, more specifically, means the downward direction opposite the direction in which the layers are stacked.

(2-1. Support Substrate)

The support substrate 105 is, for example, a substrate including an electrically insulating material. For example, the support substrate 105 may include glass such as an alkali-free glass, quartz glass, or high-heat resistant glass, or a resin such as polyethylene, polypropylene, or polyimide.

Note that in the present embodiment, when the TFT substrate is to be used in, for example, a flexible display, the support substrate 105 is detached from the flexible substrate 110. In other words, the TFT substrate 20 need not include the support substrate 105.

(2-2. Flexible Substrate)

The flexible substrate 110 may be, for example, a flexible substrate having a sheet or film-like shape. The flexible substrate 110 includes, for example, a single layer or stacked layers of a film material such as polyimide, polyethylene terephthalate, or polyethylene naphthalate.

Note that in the present embodiment, when the TFT substrate is not to be used in a flexible display, the TFT substrate 20 need not include the flexible substrate 110. In other words, the undercoat layer 115 may be disposed on the support substrate 105.

(2-3. Undercoat Layer)

The undercoat layer 115 is one example of a non-organic layer disposed on the flexible substrate 110. The undercoat layer 115 is formed on a surface of the flexible substrate 110 (on the surface that is on the same side as the oxide semiconductor layer 120). By forming the undercoat layer 115, impurities (for example, sodium and phosphorus) in the support substrate 105 (glass substrate) or the flexible substrate 110, or moisture in the atmosphere, for example, can be inhibited from infiltrating the oxide semiconductor layer 120. With this, film properties of the oxide semiconductor layer 120 can be stabilized and TFT characteristics can be stabilized.

The undercoat layer 115 is, for example, a single layer insulating layer or an insulating layer of stacked layers including an oxide insulating layer or a nitride insulating layer. As one example, a single layer film of silicon oxide ($SiO_x$), silicon nitride ($SiN_x$), silicon oxynitride ($SiON_x$), or aluminum oxide ($AlO_x$) can be used as the undercoat layer 115, or a film having stacked layers of these may be used as the undercoat layer 115. In the present embodiment, the undercoat layer 115 is a film having stacked layers formed by stacking a plurality of insulating films. The film thickness of the undercoat layer 115 is, for example, from 100 nm to 2000 nm, inclusive.

(2-4. Oxide Semiconductor Layer)

The oxide semiconductor layer 120 is used as a channel layer. More specifically, the oxide semiconductor layer 120 includes a channel region 121, a source region 122, and a drain region 123, as illustrated in FIG. 4A. The channel region 121 is a region opposing the gate electrode 140 with the gate insulating layer 130 between the channel region 121 and the gate electrode 140. The source region 122 and the drain region 123 are low-resistance regions (offset regions) having a resistivity lower than that of the channel region 121. The source region 122 and the drain region 123 are formed by, for example, generating oxygen deficiencies in predetermined regions of the film-formed oxide semiconductor. Details regarding physical properties of the film of the oxide semiconductor layer 120 will be described later.

The oxide semiconductor layer 120 is disposed above the support substrate 105 and the flexible substrate 110. More specifically, the oxide semiconductor layer 120 is disposed in a predetermined shape on the undercoat layer 115. The oxide semiconductor layer 120 includes, as a main component, an oxide of a first metal. The first metal is, for example, indium (In), gallium (Ga), or zinc (Zn). The oxide semiconductor layer 120 may include, for example, IGZO (In—Ga—Zn—O), ITZO (In—Ti—Zn—O), ZnO (Zn—O), IGO (In—Ga—O), and IZO (In—Zn—O). When, for example, the oxide semiconductor layer 120 includes IGZO, the compositional ratio of each element is, for example, $In_xGa_yZn_zO_{1.5x+1.5y+z}$ (where x, y, and z are Integers). The film thickness of the oxide semiconductor layer 120 is, for example, 10 nm to 300 nm, inclusive.

(2-5. Gate Insulating Layer)

The gate insulating layer 130 is disposed above the oxide semiconductor layer 120. More specifically, the gate insulating layer 130 is disposed between the oxide semiconductor layer 120 and the gate electrode 140, and, for example, on the oxide semiconductor layer 120.

In the present embodiment, the gate insulating layer 130 is disposed on the channel region 121 of the oxide semiconductor layer 120. More specifically, the side surfaces of the gate Insulating layer 130 are flush with the side surfaces of the channel region 121, and in a top view, the outline of the gate insulating layer 130 and the outline of the channel region 121 are approximately aligned. Note that although the gate insulating layer 130 is disposed only on the oxide semiconductor layer 120 in the present embodiment, this example is not limiting.

The gate insulating layer 130 is, for example, a single layer insulating layer or an insulating layer of stacked layers including an oxide insulating layer or a nitride insulating layer. A single layer film of silicon oxide ($SiO_x$), silicon nitride ($SiN_x$), silicon oxynitride ($SiON_x$), aluminum oxide ($AlO_x$), or tungsten oxide ($TaO_x$) can be used as the gate insulating layer 130, or a film having stacked layers of these may be used as the gate insulating layer 130. The film thickness of the gate insulating layer 130 can be set based on, for example, the breakdown voltage of the TFT, and is, for example, 50 nm to 400 nm, inclusive.

(2-6. Gate Electrode)

The gate electrode 140 is disposed at a position that is above the gate insulating layer 130 and opposing the channel region 121. For example, the gate electrode 140 is formed in a predetermined shape on the gate insulating layer 130. More specifically, the side surfaces of the gate electrode 140 are flush with the side surfaces of the gate insulating layer 130, and in a top view, the outline of the gate electrode 140 and the outline of the gate insulating layer 130 are approximately aligned.

The gate electrode 140 is an electrode having a single layer structure or a stacked layer structure including an electrically conductive material such as metal or an alloy thereof. The gate electrode 140 may include, for example, aluminum (Al), molybdenum (Mo), tungsten (W), molybdenum-tungsten (MoW), copper (Cu), titanium (Ti), and chromium (Cr). The film thickness of the gate electrode 140 is, for example, from 50 nm to 300 nm, inclusive.

(2-7. Metal Oxide Layer)

The metal oxide layer 150 is disposed on the oxide semiconductor layer 120 and is in contact with the source region 122 and the drain region 123. In the present embodiment, the metal oxide layer 150 is disposed on the portion of the top surface of the oxide semiconductor layer 120 that is not covered by the gate insulating layer 130. More specifically, the metal oxide layer 150 is disposed on the source region 122 and the drain region 123.

Even more specifically, the metal oxide layer 150 covers the top and side surface of the gate electrode 140, the side surface of the gate insulating layer 130, and the top surfaces of the source region 122 and the drain region 123. Note that the metal oxide layer 150 need only be disposed on the source region 122 and the drain region 123; for example, the metal oxide layer 150 need not be formed on the gate electrode 140.

Moreover, a plurality of openings (contact holes) are formed through predetermined regions in the metal oxide layer 150 and interlayer insulating layer 170. The source region 122 and the source electrode 180s are electrically and physically connected via these contact holes, and the drain region 123 and the drain electrode 180d are electrically and physically connected via these contact holes.

The metal oxide layer 150 is a low-resistance promotion layer that promotes low-resistance of the oxide semiconductor layer 120. In the present embodiment, the metal oxide layer 150 promotes low-resistance of the source region 122 and drain region 123 of the oxide semiconductor layer 120. More specifically, the metal oxide layer 150 removes oxygen from the source region 122 and the drain region 123 to generate oxygen deficiencies. With this, the resistance of the source region 122 and the drain region 123 decreases.

The source region 122 and the drain region 123 are regions electrically connected to the source electrode 180s and the drain electrode 180d, respectively. Consequently, the source region 122 and the drain region 123 preferably have low contact resistance. Since the metal oxide layer 150 reduces the resistance of the source region 122 and the drain region 123, the contact resistance also decreases, thereby increasing TFT characteristics.

The metal oxide layer 150 includes, as a main component, an oxide of a second metal whose bond dissociation energy with oxygen is higher than that of the first metal included in the oxide semiconductor layer 120. The second metal is, for example, aluminum (Al), titanium (TI), molybdenum (Mo), or tungsten (W). The metal oxide layer 150 is of a film thickness sufficient to remove oxygen from the oxide semiconductor layer 120, and in the case of aluminum oxide, is, for example, 10 nm or higher, and preferably 20 nm or higher. Moreover, the film density of the metal oxide layer 150 is, in the case of aluminum oxide, 2.7 $g/cm^3$ or less.

Note that the bond dissociation energy between the first metal and oxygen is as follows. Specifically, the bond dissociation energy between indium (In) and oxygen is 360 kJ/mol. The bond dissociation energy between zinc (Zn) and oxygen is 284 kJ/mol. The bond dissociation energy between gallium (Ga) and oxygen is 285 kJ/mol.

The bond dissociation energy between the second metal and oxygen is as follows. Specifically, the bond dissociation energy between aluminum (Al) and oxygen is 512 kJ/mol. The bond dissociation energy between titanium (Ti) and oxygen is 662 kJ/mol. The bond dissociation energy between molybdenum (Mo) and oxygen is 607 kJ/mol. The bond dissociation energy between tungsten (W) and oxygen is 653 kJ/mol.

(2-8. Interface Layer)

The interface layer 160 is a layer formed at the Interface between the oxide semiconductor layer 120 and the metal oxide layer 150. More specifically, the interface layer 160 is formed as a result of the metal oxide layer 150 being stacked on the oxide semiconductor layer 120. Even more specifically, the interface layer 160 is formed as a result of the metal oxide layer 150 being in contact with the oxide semiconductor layer 120 and drawing oxygen out of the oxide semiconductor layer 120.

As Illustrated in FIG. 4B, the oxide semiconductor layer 120 and the metal oxide layer 150 include the bulk layer 125 of the oxide semiconductor layer 120, the Interface layer 160, and the bulk layer 155 of the metal oxide layer 150. Note that FIG. 4B Illustrates a cross section taken in the vicinity of the interface between the source region 122 or the drain region 123 and the metal oxide layer 150.

The interface layer 160 includes a top surface region of the oxide semiconductor layer 120 removed of oxygen due to its top surface being in contact with the metal oxide layer 150, and a bottom surface region of the metal oxide layer 150 infused with oxygen due to its bottom surface being in contact with the oxide semiconductor layer 120. In other words, the interface layer 160 includes the interface between the oxide semiconductor layer 120 and the metal oxide layer 150, and includes the top surface region of the oxide semiconductor layer 120 and the bottom surface region of the metal oxide layer 150.

Note that the interface layer 160 may include only the top surface region of the oxide semiconductor layer 120. Alternatively, the interface layer 160 may include only the bottom surface region of the metal oxide layer 150.

The bulk layer 125 is the region of the oxide semiconductor layer 120 excluding the interface with the metal oxide layer 150. More specifically, the bulk layer 125 is a region in which the concentration distribution of elements included in the oxide semiconductor layer 120 is stable. For example, in the bulk layer 125, the concentration distribution of the first metal (In, Ga, Zn) is approximately consistent, but the bulk layer 125 for the most part does not include the second metal (Al) included in the metal oxide layer 150.

The bulk layer 155 is the region of the metal oxide layer 150 excluding the interface with the oxide semiconductor layer 120.

More specifically, the bulk layer 155 is a region in which the concentration distribution of elements included in the metal oxide layer 150 is stable. For example, in the bulk layer 155, the concentration distribution of the second metal (Al) is approximately consistent, but the bulk layer 155 for the most part does not include the first metal (In, Ga, Zn) included in the oxide semiconductor layer 120.

The concentration ratio (first concentration ratio) of oxygen to the second metal in the interface layer 160 is greater than the concentration ratio (second concentration ratio) of oxygen to the second metal in the bulk layer 155 of the metal oxide layer 150. For example, when the second metal is aluminum, the O/Al ratio in the interface layer 160 is greater than the O/Al ratio in the bulk layer 155. In the present embodiment, the O/Al ratio in the Interface layer 160 is 0.6 or less. Details regarding physical properties of the film of the interface layer 160 will be described later.

(2-9. Interlayer Insulating Layer)

The interlayer insulating layer 170 is disposed to cover the metal oxide layer 150. More specifically, the interlayer insulating layer 170 is formed to cover the entire surface of the element region where the thin-film transistor 100 is formed.

The interlayer insulating layer 170 includes, as a main component, an organic substance or a non-organic substance. For example, a single layer film of silicon oxide ($SiO_x$), silicon nitride ($SiN_x$), silicon oxynitride ($SiON_x$), or aluminum oxide ($AlO_x$) can be used as the interlayer insulating layer 170, or a film having stacked layers of these may be used as the interlayer insulating layer 170. Here, the interlayer insulating layer 170 may be formed as a thick film using a material having a low relative permittivity. With this, the parasitic capacitance between the gate electrode 140 and the source electrode 180s or the drain electrode 180d can be reduced.

Note that the interlayer insulating layer 170 has a different film property from that of metal oxide layer 150, for example. For example, when both the interlayer insulating layer 170 and the metal oxide layer 150 include the same metal oxide as a main component, the interlayer insulating layer 170 has a more dense film property than the metal oxide layer 150. More specifically, the film density of the interlayer insulating layer 170 is greater than the film density of the metal oxide layer 150.

(2-10. Source Electrode and Drain Electrode)

The source electrode 180s and the drain electrode 180d are formed in a predetermined shape on the interlayer insulating layer 170. The source electrode 180s and the drain electrode 180d are electrically connected to the oxide semiconductor layer 120.

In the present embodiment, the source electrode 180*s* is electrically and physically connected to the source region 122 via the contact hole formed in the interlayer insulating layer 170 and the metal oxide layer 150. Moreover, the drain electrode 180*d* is electrically and physically connected to the drain region 123 via the contact hole formed in the interlayer insulating layer 170 and the metal oxide layer 150.

The source electrode 180*s* and the drain electrode 180*d* are electrodes having a single layer structure or a stacked layer structure including an electrically conductive material or an alloy thereof. The source electrode 180*s* and the drain electrode 180*d* may include, for example, aluminum (Al), molybdenum (Mo), tungsten (W), molybdenum-tungsten (MoW), copper (Cu), titanium (Ti), and chromium (Cr). The film thickness of the source electrode 180*s* and the drain electrode 180*d* is, for example, from 50 nm to 300 nm, inclusive.

(3. Film Physical Properties of Interface Layer and Vicinity Thereof)

Next, the film physical properties of the interface layer 160 of the thin-film transistor 100 and the vicinity of the interface layer 160 according to the present embodiment will be described.

The inventors of the present invention fabricated a plurality of samples Including the oxide semiconductor layer 120 according to the present embodiment in order to find out the film physical properties of the interface layer 160 and the vicinity thereof. More specifically, the Inventors fabricated a sample in which the oxide semiconductor layer 120 is film-formed on a glass substrate (sample A), and samples in which the oxide semiconductor layer 120 and the metal oxide layer 150 were formed, in the listed order, on a glass substrate (sample B and sample C). Note that a film property of the metal oxide layer 150 is different in sample B and sample C.

The oxide semiconductor layer 120 is an IGZO film, and the metal oxide layer 150 is an $AlO_x$ film. The film thickness of the IGZO film is approximately 60 nm, and the film thickness of the $AlO_x$ film is approximately 30 nm. Film forming of the IGZO film and the $AlO_x$ film was done in a room-temperature atmosphere using a reactive sputtering method; no heat treatment was performed during the film forming or after the film forming of the IGZO film and the $AlO_x$ film.

Figure 5:
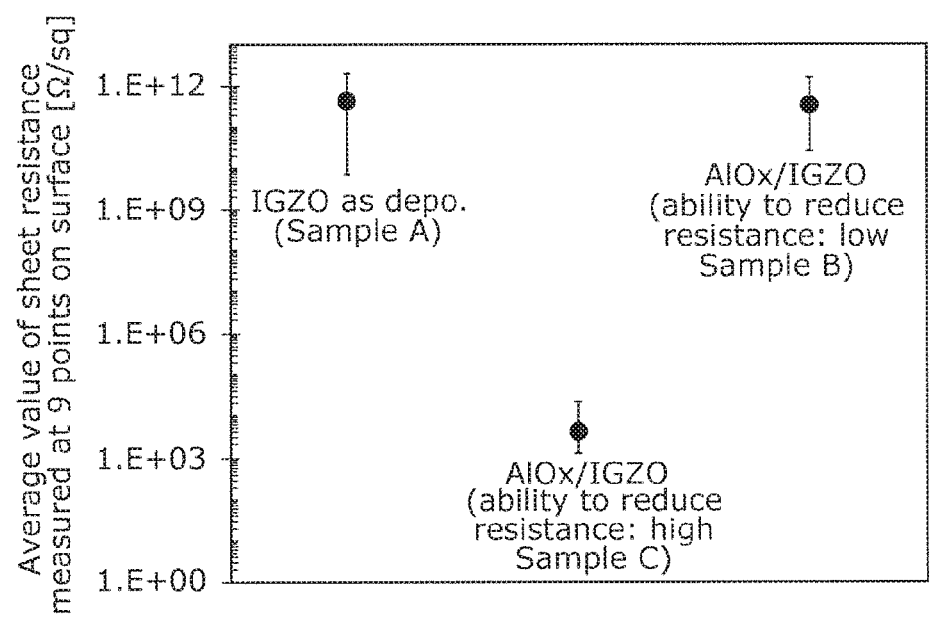
FIG. 5 illustrates oxide semiconductor sheet resistance for samples fabricated according to an embodiment.

FIG. 5 illustrates the oxide semiconductor sheet resistance for samples A through C fabricated according to the present embodiment. Note that the four-terminal sensing method was used to measure sheet resistance at 9 points on the surface, and the average of those values are shown in FIG. 5 as the sheet resistance for each sample.

As illustrated in FIG. 5, the sheet resistance of sample A is a few hundred GΩ/sq. This shows that the IGZO film has a substantially high sheet resistance at the time of forming the IGZO film. The sheet resistance of sample B is also a few hundred GΩ/sq (high sheet resistance). In contrast, the sheet resistance of sample C is low at only a few kΩ/sq.

From the above, the Inventors of the present invention realized that a specific $AlO_x$ film among the $AlO_x$ films formed using reactive sputtering can function as a low-resistance promotion layer that can reduce the resistance of the oxide semiconductor. The method for forming the metal oxide layer ($AlO_x$) that functions as a low-resistance promotion layer will be described in detail later.

Note that when the $AlO_x$ film was removed using an organic alkali solution for selectively etching $AlO_x$ film after reducing the resistance of the IGZO film, the sheet resistance of the IGZO film returned to a few hundred GΩ/sq. For this reason, the film physical properties of the interface layer between the IGZO film and the $AlO_x$ film is important for reducing the resistance of the IGZO film.

Figure 6A:
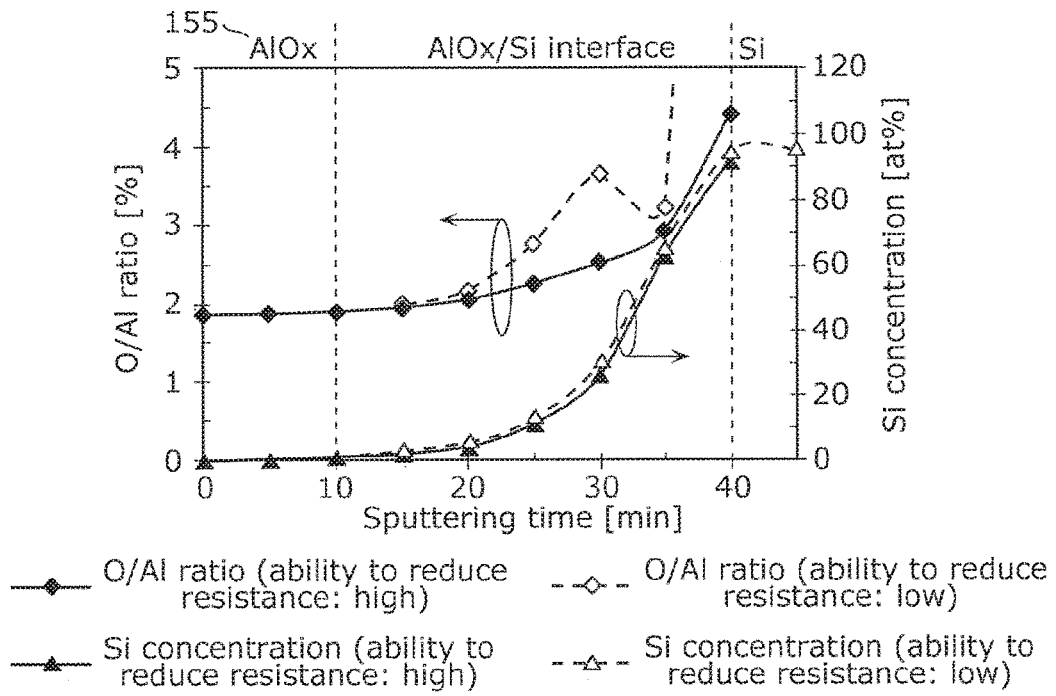
FIG. 6A illustrates a concentration distribution of elements in an interface layer between a metal oxide layer and a silicon substrate in samples fabricated according to an embodiment.
Figure 6B:
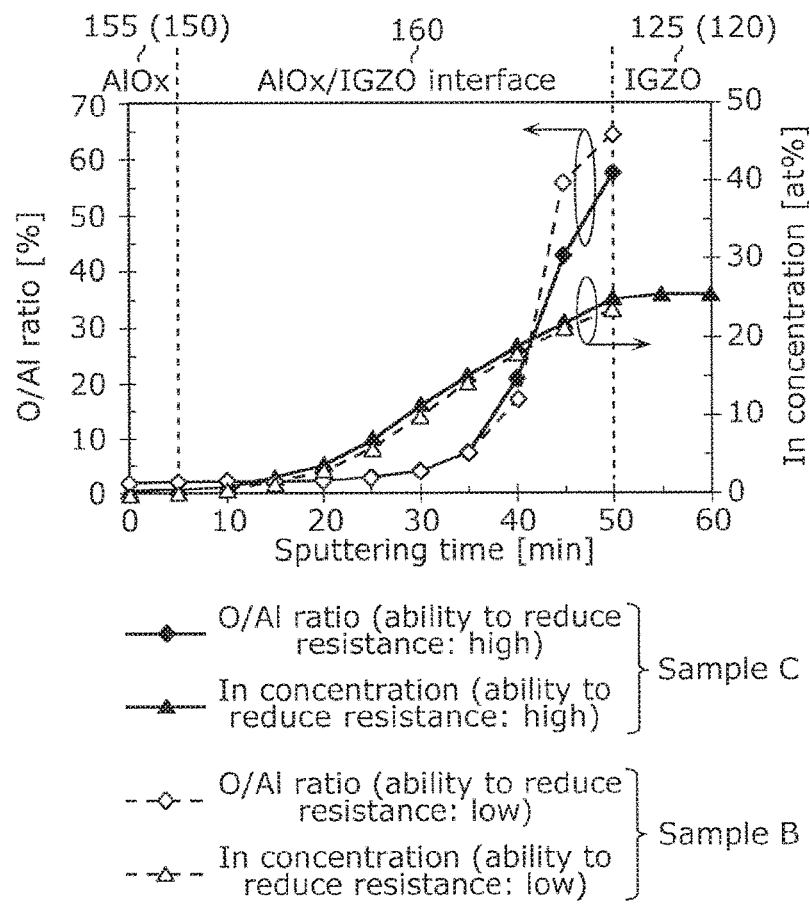
FIG. 6B illustrates a concentration distribution of elements in an Interface layer between a metal oxide layer and an oxide semiconductor layer in samples fabricated according to an embodiment.

FIG. 6A illustrates a concentration distribution of elements in the interface layer between the metal oxide layer 150 and a silicon substrate in a sample fabricated according to the present embodiment. FIG. 6B Illustrates a concentration distribution of elements in the interface layer 160 between the metal oxide layer 150 and the oxide semiconductor layer 120 in a sample fabricated according to the present embodiment.

Here, the metal oxide layer 150 is an $AlO_x$ film, and the oxide semiconductor layer 120 is an IGZO film. More specifically, in the manufacturing of the samples illustrated in FIG. 6A and FIG. 6B, film forming of the IGZO film and the $AlO_x$ film was done in a room-temperature atmosphere using a reactive sputtering method; no heat treatment was performed during the film forming or after the film forming of the IGZO film and the $AlO_x$ film. Note that the samples in FIG. 6B are sample B and sample C described above.

The measurement of concentration distribution of elements was done using an X-ray photoelectron spectroscopy method (XPS). More specifically, the $AlO_x$ film in each sample was removed by sputtering in the depthwise direction, and using the XPS method, the concentration distribution of elements in the surface was measured. Note that in the fabricated sample, a 30 nm $AlO_x$ stacked film is formed, but analysis of the element concentration with the XPS method was done after a predetermined thickness of the $AlO_x$ was removed in advance.

In FIG. 6A and FIG. 6B, sputtering time is represented on the horizontal axis. More specifically, the sputtering time is equivalent to depth of the film. Concentration ratio of oxygen to aluminum (O/Al ratio) and silicon concentration or indium concentration is represented on the vertical axis. Note that the O/AL ratio was calculated by measuring the atom concentration [at %] of oxygen in the film and the atom concentration [at %] of aluminum in the film.

As illustrated in FIG. 6A and FIG. 6B, the longer the sputtering time is—In other words, the deeper the analysis used in the XPS goes—the more stable and constant the O/Al ratio initially is. For example, in either of FIG. 6A and FIG. 6B, the O/Al ratio is about a stable 2%. The region in which the O/Al ratio is stable corresponds to the bulk layer 155 of the metal oxide layer 150. More specifically, in the bulk layer 155, the compositional ratio of oxygen and aluminum elements is stable.

In the interface layer 160, the O/Al ratio gradually Increases with progression in the depthwise direction. This trend can be seen in both FIG. 6A and FIG. 6B. Stated differently, a film property of metal oxide layer 150 is not dependent on the underlayer (here, the silicon substrate or the IGZO film).

On the other hand, focusing on the silicon concentration and indium concentration, after these increase with progression in the depthwise direction they stabilize at a constant value. For example, in the example illustrated in FIG. 6A, silicon concentration is stable at about 100 at %, and in the example illustrated in FIG. 6B, indium concentration is stable at about 25 at %. The region in which the indium concentration is stable corresponds to the bulk layer 125 of the oxide semiconductor layer 120.

The interface layer 160 between the metal oxide layer 150 and the oxide semiconductor layer 120 is a region excluding the bulk layer 155 and the bulk layer 125. In other words, the interface layer 160 is the region in which both the O/Al ratio and the indium concentration are unstable. In the example illustrated in FIG. 6B, the sputtering time of the interface layer 160 corresponds to between 5 minutes and 50 minutes.

Next we will focus on the sputtering time between about 20 minutes to 35 minutes in FIG. 6A and between about 40 minutes and 50 minutes in FIG. 6B. Here, the sample including the $AlO_x$ film having a high ability to reduce resistance (for example, sample C) has a smaller O/Al ratio than the sample including the $AlO_x$ film having a low ability to reduce resistance (for example, sample B). More specifically, it was discovered that a more aluminum rich $AlO_x$ film is formed in the interface layer 160 of sample C than in the interface layer 160 of sample B.

Moreover, for example, the rate at which the O/Al ratio in sample C increases is lower than the rate at which the O/Al ratio in sample B increases. That is to say, as illustrated in FIG. 6B, the slope of the O/Al ratio in sample C is not as steep as the slope of the O/Al ratio in sample B.

Moreover, as the graph of the O/Al ratio of sample C in FIG. 6B shows, the O/Al ratio in the interface layer 160 is 0.6 or less (in other words, 60% or less). Even more specifically, the O/Al ratio at the interface between the interface layer 160 and the bulk layer 125 is 60% or less, which is lower than the O/Al ratio of sample C.

With an oxide semiconductor such as an IGZO semiconductor, by generating oxygen deficiencies the film, a plurality of levels of deficiency can be formed to reduce resistance. Here, in the interface layer 160, as a result of the aluminum rich $AlO_x$ film coming in contact with the IGZO film, oxygen is drawn from the IGZO film to the $AlO_x$ side. With this, oxygen deficiencies generate in the IGZO film and the resistance of the IGZO film decreases.

Thus, so long as the goal is to reduce the resistance of the oxide semiconductor layer 120, the metal oxide layer 150 is not limited to an $AlO_x$ film. More specifically, the metal oxide layer 150 need only include, as a main component, an oxide of a second metal whose bond dissociation energy with oxygen is higher than that of the first metal included in the oxide semiconductor layer 120.

Next, the difference between the $AlO_x$ film having a high ability to reduce resistance and the $AlO_x$ film having a low ability to reduce resistance will be discussed in more detail. The Inventors of the present invention measured the film density of the $AlO_x$ films in sample B and sample C using the X-ray reflectivity (XRR) method. The results were as follows: the $AlO_x$ film having a high ability to reduce resistance had a film density of 2.7 g/cm3 or less, and the $AlO_x$ film having a low ability to reduce resistance had a film density of approximately 3.4 g/cm3.

Thus, the $AlO_x$ film having a low film density (sparse) can be considered to be a film having a strong ability to remove oxygen from an oxide semiconductor.

As described above, with the thin-film transistor 100 according to the present embodiment, the stacked structure including the metal oxide layer 150 and the oxide semiconductor layer 120 includes a region whose concentration ratio of oxygen to the second metal (more specifically, O/Al ratio) is greater than a concentration ratio of oxygen to the second metal in the bulk layer 155 of the metal oxide layer 150. This region is located in the vicinity of the interface between the metal oxide layer 150 and the oxide semiconductor layer 120, as illustrated in FIG. 6B.

Moreover, the stacked structure including the metal oxide layer 150 and the oxide semiconductor layer 120 includes a region whose concentration ratio of oxygen to the second metal gradually increases in a direction from the metal oxide layer 150 to the oxide semiconductor layer 120. This region is located in the vicinity of the interface between the metal oxide layer 150 and the oxide semiconductor layer 120, as illustrated in FIG. 6B.

(4. TFT Fabrication Method)

Next, the method of fabricating the thin-film transistor 100 according to the present embodiment will be described with reference to FIG. 7A through FIG. 7E. FIG. 7A through FIG. 7E are cross-sectional diagrams illustrating fabrication processes of the thin-film transistor 100 according to the present embodiment.

Figure 7A:
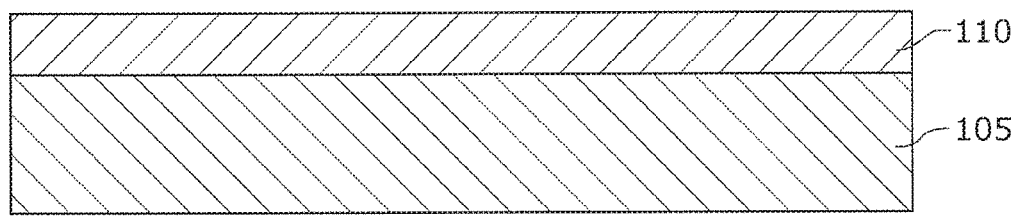
FIG. 7A is a diagram of a cross section of a thin-film transistor according to an embodiment illustrating a fabrication process.
Figure 7A:
Figure 7A:
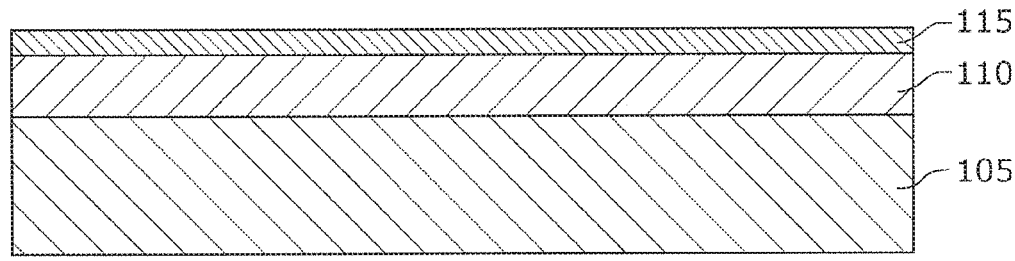
Figure 7A:
Figure 7A:
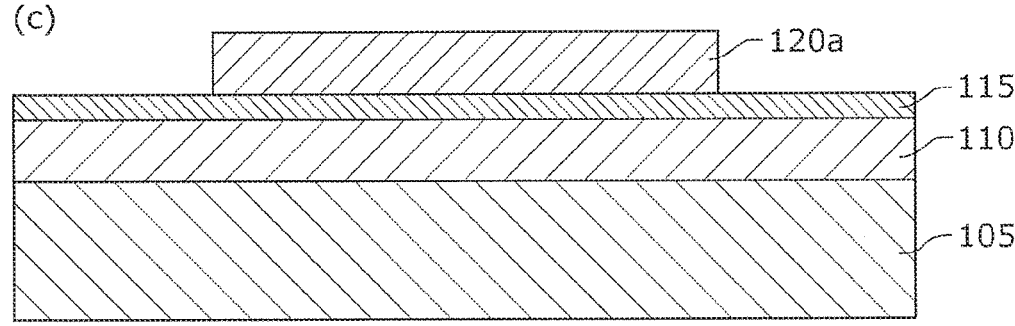

First, as illustrated in (a) in FIG. 7A, the support substrate 105, to which the flexible substrate 110 is attached, is prepared. A glass substrate such as a non-alkali glass substrate is used as the support substrate 105, but a resin, silica, or a thermally-oxidized film silicon substrate may be used. The flexible substrate 110 may include, for example, polyimide.

Next, as illustrated in (b) in FIG. 7A, the undercoat layer 115 is formed on the flexible substrate 110. For example, a silicon oxide layer is formed as the undercoat layer 115 using, for example, a chemical vapor deposition (CVD) method, sputtering method, or atomic layer deposition (ALD) method.

Next, as illustrated in (c) in FIG. 7A, the oxide semiconductor layer 120a is formed above the flexible substrate 110 (the support substrate 105). In the present embodiment, the oxide semiconductor layer 120a is disposed in a predetermined shape on the undercoat layer 115. The oxide semiconductor layer 120a may include an IGZO transparent amorphous oxide semiconductor. For example, a 60 nm IGZO film may be formed as the oxide semiconductor layer 120a.

In this case, an oxide semiconductor film including IGZO is formed using a sputtering method, a laser ablation method, or a CVD method, for example. More specifically, a target material including IN, Ga, and Zn (for example, a polycrystalline sintered body having an $InGaO_3(ZnO)_4$ composition) is used, argon gas as an inert gas and a gas including oxygen ($O_2$) as a reactive gas are introduced into a vacuum chamber, and electricity of a predetermined power density is applied.

Then, the oxide semiconductor layer 120a is formed in a predetermined shape by patterning a formed oxide semiconductor film using a photolithography or wet etching method, as is illustrated in FIG. 7A. The oxide semiconductor layer 120a is formed as an island having a predetermined shape. Note that for the wet etching of the IGZO, a mixed chemical solution of, for example, phosphoric acid ($H_3PO_4$), nitric acid ($HNO_3$), acetic acid ($CH_3COOH$), and water ($H_2O$) can be used.

Figure 7B:
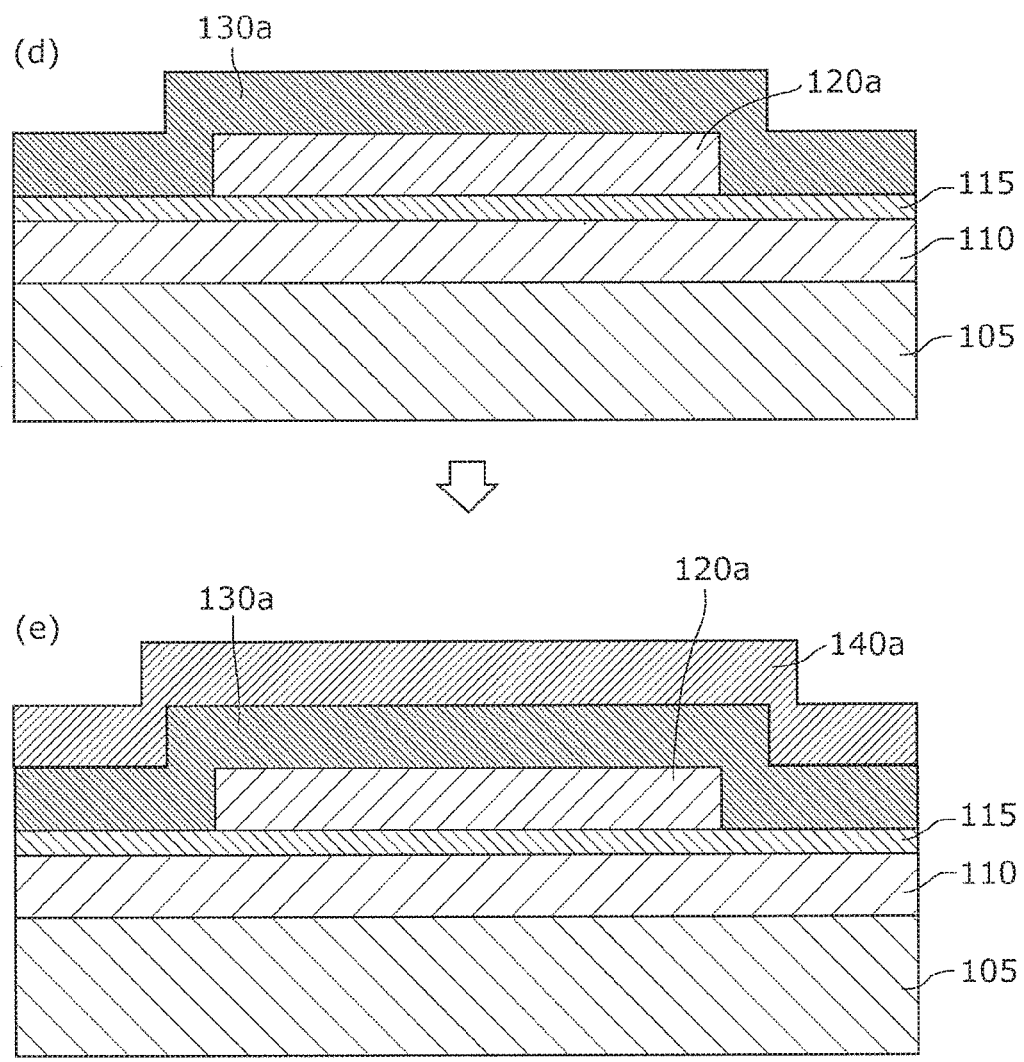
FIG. 7B is a diagram of a cross section of a thin-film transistor according to an embodiment illustrating a fabrication process.

Next, as illustrated in (d) in FIG. 7B, a gate insulating film 130a is formed above the oxide semiconductor layer 120a. In the present embodiment, the gate insulating film 130a is formed over the entire surface so as to cover the oxide semiconductor layer 120a. The gate insulating film 130a may include $SiO_x$. For example, a 100 nm $SiO_x$ film can be formed as the gate insulating film 130a.

The $SiO_x$ film can be formed using a CVD method, for example. More specifically, the $SiO_x$ film can be formed by introducing a silane gas ($SiH_4$) and a nitrous oxide gas ($N_2O$) into a vacuum chamber and generating plasma.

Next, as Illustrated in (e) in FIG. 7B, a gate metal film 140a is formed above the gate insulating film 130a. For example, an 80 nm MoW film can be formed as the gate metal film 140a on the gate insulating film 130a using, for example, a sputtering method.

Figure 7C:
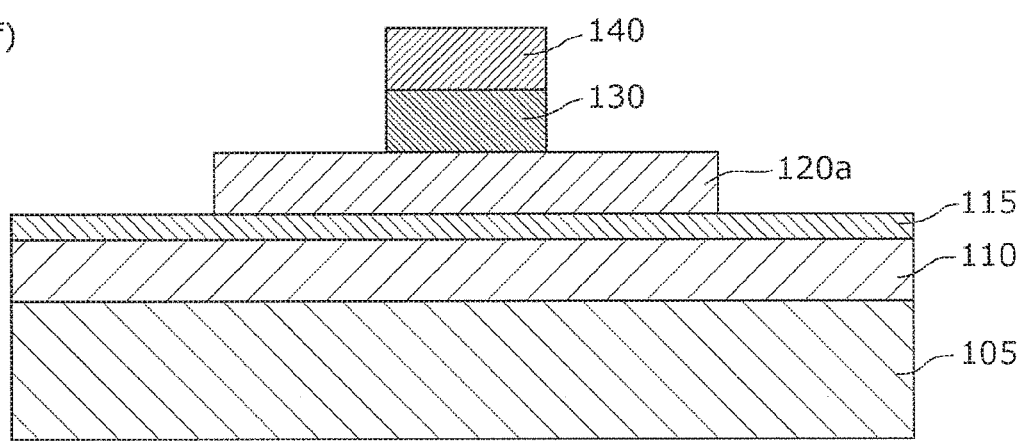
FIG. 7C is a diagram of a cross section of a thin-film transistor according to an embodiment illustrating a fabrication process.
Figure 7C:
Figure 7C:
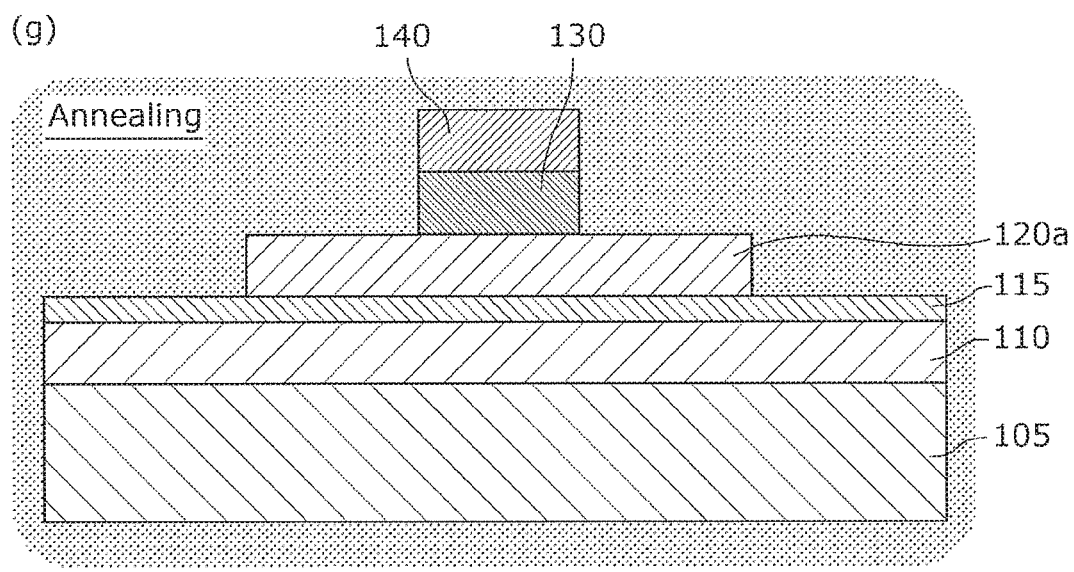

Next, as illustrated in (f) in FIG. 7C, the gate electrode 140 and the gate insulating layer 130 are formed above the oxide semiconductor layer 120a by processing the gate metal film 140a and the gate insulating film 130a. In the present embodiment, the gate electrode 140 is formed above the gate insulating layer 130.

More specifically, first, the gate electrode 140 is formed in a predetermined shape on the gate insulating film 130a by patterning the gate metal film 140a using a photolithography method and an etching method. For the etching of the MoW film, wet etching using a mixed chemical solution of, for example, phosphoric acid ($H_3PO_4$), nitric acid ($HNO_3$), acetic acid ($CH_3COOH$), and water ($H_2O$) can be performed. Alternatively, for the etching of the MoW film, dry etching such as reactive ion etching (RIE) using a gas such as sulfur hexafluoride ($SF_6$), oxygen ($O_2$), or chlorine ($Cl_2$) can be performed.

Then, the gate insulating layer 130 having the same shape as the gate electrode 140 is formed in a self-aligned fashion by patterning the gate insulating film 130a using as a mask the gate electrode 140 formed in a predetermined shape. For the etching of the gate insulating film 130a ($SiO_x$), wet etching using, for example, a hydrofluoric acid (HF) solution, or dry etching using a gas such as sulfur hexafluoride ($SF_6$) can be performed. In the present embodiment, for example, processing of the gate metal film 140a and the gate insulating film 130a can be performed in a continuous manner by dry etching. In this way, the oxide semiconductor layer 120 is exposed and the gate electrode 140 is formed.

After the gate electrode 140 is formed, heat treatment (annealing) is performed, as illustrated in (g) in FIG. 7C. By annealing the oxide semiconductor layer 120a, the electrical characteristics of the oxide semiconductor layer 120a can be restored. The Annealing is performed in the atmosphere at 200° C. to 500° C., inclusive, for 0.5 hours to 5 hours, inclusive.

After the heat treatment, the resistance of the region of the oxide semiconductor layer 120a that is in contact with the metal oxide layer 150 is reduced by forming the metal oxide layer 150 on the oxide semiconductor layer 120a by reactive sputtering. More specifically, the metal oxide layer 150 in direct contact with the exposed portion of the oxide semiconductor layer 120 is formed by reactive sputtering. With this, the low-resistance source region 122 and drain region 123 of the oxide semiconductor layer 120 are formed, as illustrated in (h) in FIG. 7D.

More specifically, the metal oxide layer 150 is formed so as to cover the top and side surface of the gate electrode 140, the side surface of the gate insulating layer 130, and the top surfaces of the source region 122 and the drain region 123. Note that the metal oxide layer 150 may be formed only in the region of the oxide semiconductor layer 120a that is not covered by the gate Insulating layer 130. In other words, the metal oxide layer 150 may be formed only on the top surface of the source region 122 and the top surface of the drain region 123. For example, 30 nm of $AlO_x$ is formed as the metal oxide layer 150 by reactive sputtering.

Figure 7D:
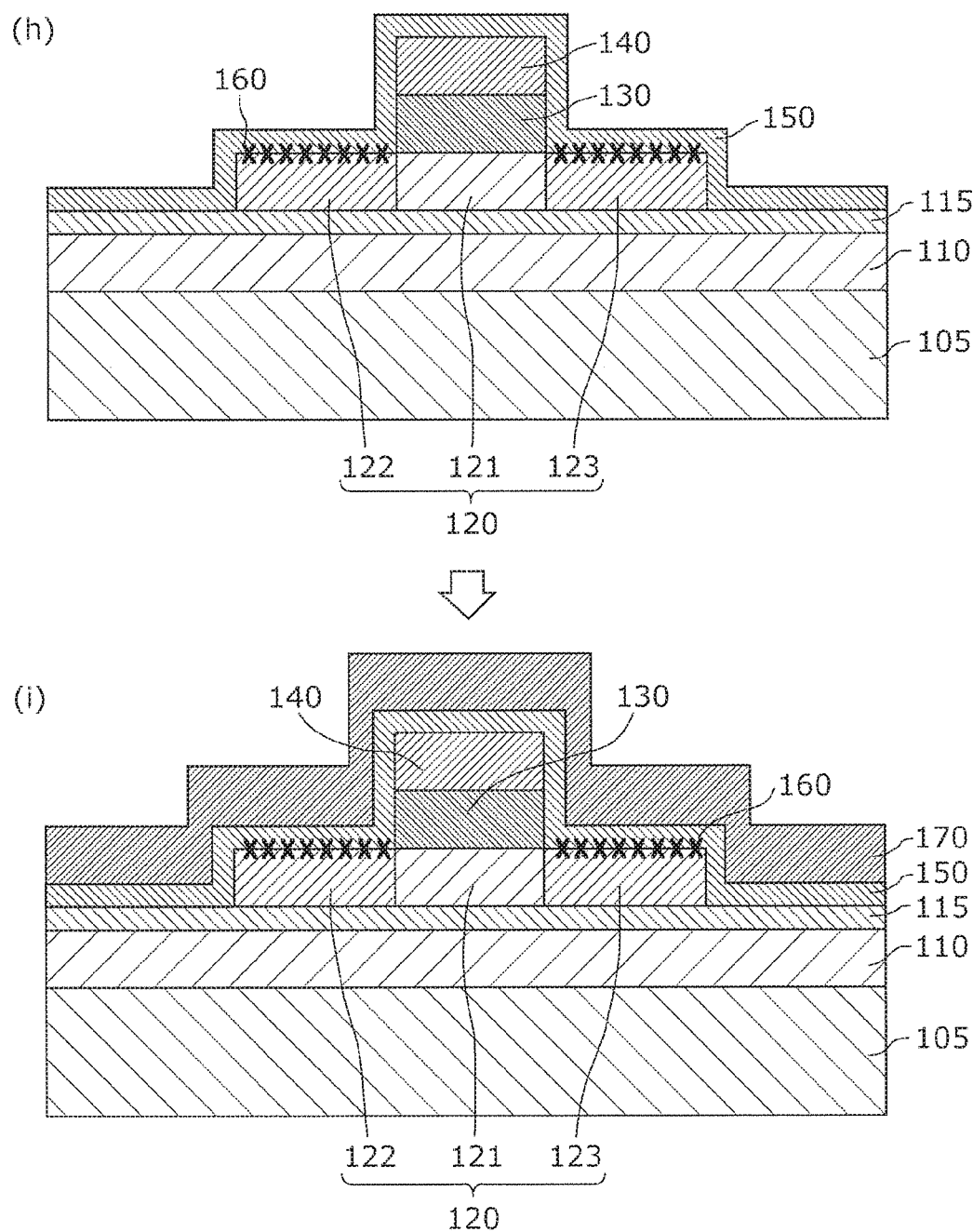
FIG. 7D is a diagram of a cross section of a thin-film transistor according to an embodiment illustrating a fabrication process.

Next, as illustrated in (i) in FIG. 7D, the interlayer insulating layer 170 is formed so as to cover the gate electrode 140 and the oxide semiconductor layer 120. For example, a 200 nm silicon oxide film is formed as the interlayer insulating layer 170 by plasma CVD.

Figure 7E:
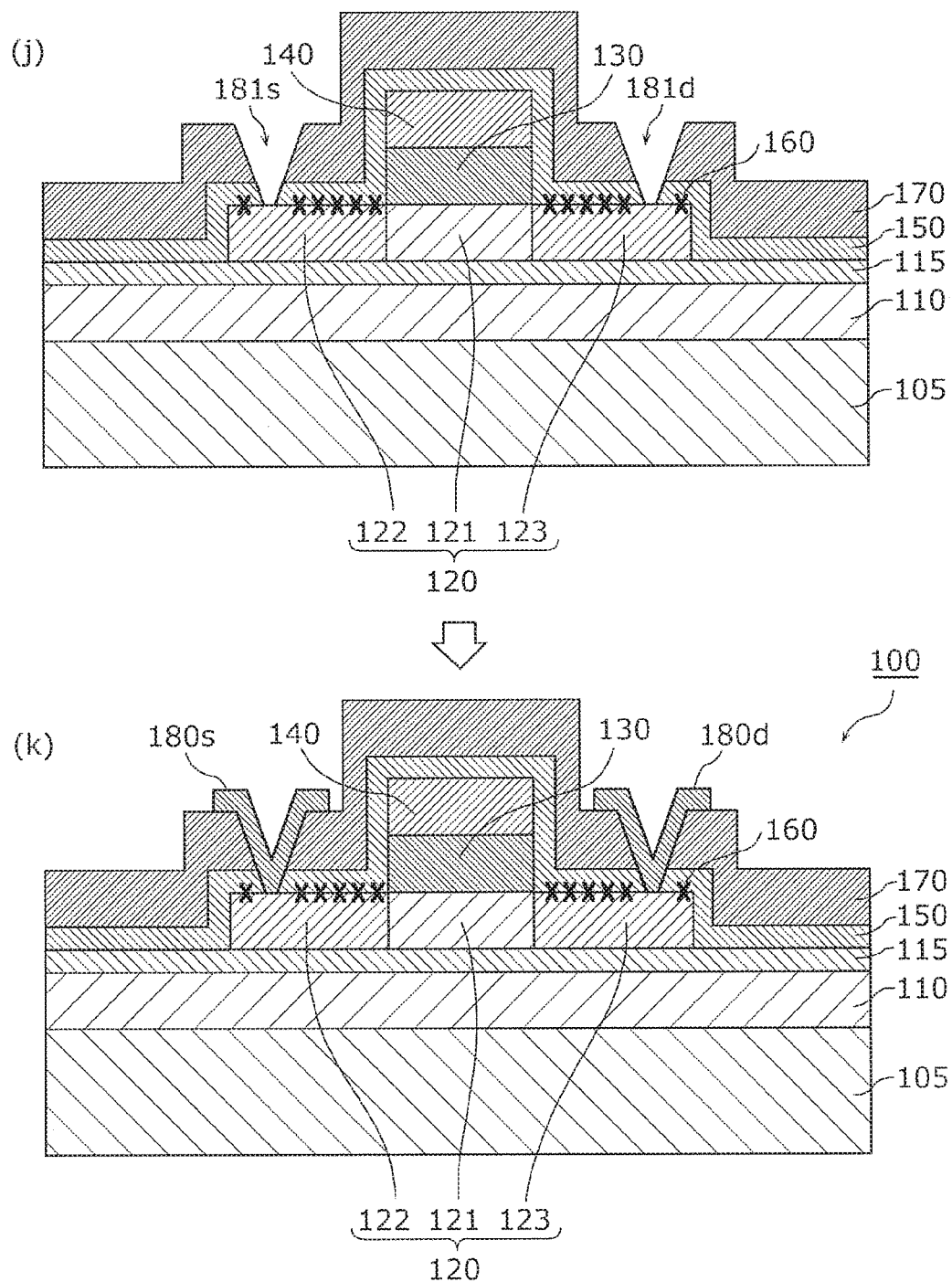
FIG. 7E is a diagram of a cross section of a thin-film transistor according to an embodiment illustrating a fabrication process.

Next, as illustrated in (j) in FIG. 7E, openings (contact holes 181s and 181d) are formed in the interlayer insulating layer 170 and the metal oxide layer 150 so as to expose a portion of the source region 122 and a portion of the drain region 123. More specifically, the contact holes 181s and 181d are formed on the source region 122 and the drain region 123, respectively, by etching away a portion of the interlayer insulating layer 170 and a portion of the metal oxide layer 150 with a photolithography or etching method.

For example, when the interlayer insulating layer 170 is a silicon oxide film, the contact hole may be formed by dry etching such as RIE. In this case, carbon tetrafluoride ($CF_4$) and oxygen gas ($O_2$), for example, can be used as the etching gas. Moreover, when the metal oxide layer 150 is an $AlO_x$ film, for example, wet etching using a tetramethylammonium hydroxide (TMAH) aqueous solution or dry etching using a gas such as boron trichloride ($BCl_3$) can used to form the contact hole.

Next, as illustrated in (k) in FIG. 7E, the source electrode 180s electrically and physically connected to the source region 122 and the drain electrode 180d electrically and physically connected to the drain region 123 via the contact holes 181s and 181d formed in the interlayer insulating layer 170 and the metal oxide layer 150 are formed. More specifically, first, to fill the contact holes 181s and 181d, a metal film (source drain metal film) is formed on the interlayer insulating layer 170 by sputtering. The source electrode 180s and the drain electrode 180d are formed in a predetermined shape by patterning the formed metal film using a photolithography method and a wet etching method. For example, a MoW-Al-MoW three-layered structure metal film having a total thickness of 500 nm is formed as the source electrode 180s and the drain electrode 180d.

This is how the thin-film transistor 100 according to the present embodiment can be fabricated.

Note that the organic EL elements 40 can be formed above the thin-film transistor 100 after a planarizing film, for example, is formed.

(5. Reactive Sputtering)

Here, the reactive sputtering used to form the metal oxide layer 150 having a high ability to reduce resistance will be described with reference to FIG. 8A and FIG. 8B.

Figure 8A:
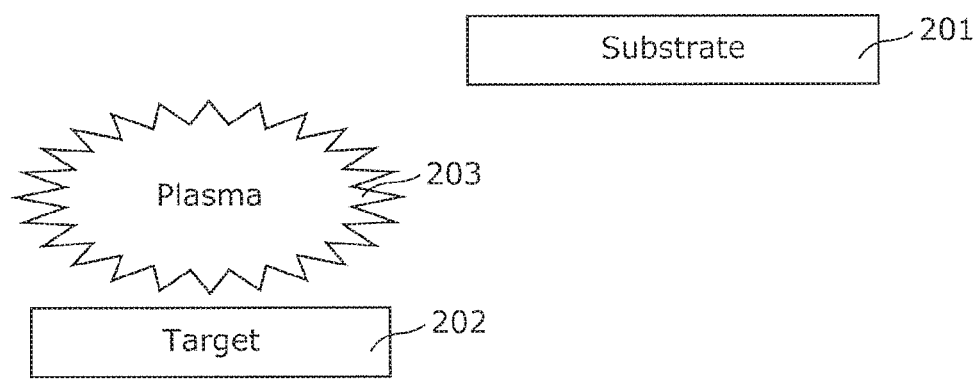
FIG. 8A illustrates the positioning of a substrate and a target in reactive sputtering used when forming a metal oxide layer according to an embodiment.

FIG. 8A illustrates the positioning of the substrate 201 and the target 202 in reactive sputtering used when forming the metal oxide layer 150 according to the present embodiment, and the positioning of the substrate 201 and the target 202 at the start of film forming in a typical in-line sputtering device used when fabricating a large TFT substrate. Moreover, FIG. 8B illustrates the positioning of the substrate 201 and the target 202 in standard reactive sputtering. More specifically, FIG. 8A illustrates the positioning of the substrate 201 and the target 202 in what is known as a low-damage sputtering device. Moreover, FIG. 8B illustrates the positioning of the substrate 201 and the target 202 in a standard sputtering device, and the positioning of the substrate 201 and the target 202 after the film forming has progressed to some extent in a typical in-line sputtering device.

The substrate 201 is a substrate mid-fabrication of the thin-film transistor 100. More specifically, the substrate 201 corresponds to the support substrate 105 directly after the gate electrode 140 is formed, as Illustrated in (g) in FIG. 7C. The support substrate 105 is disposed such that the surface on the same side as the gate electrode 140 (i.e., the top surface) is facing the target 202 side (i.e., facing downward).

The target 202 is a metal material having, as a main component, the second metal included in the metal oxide layer 150. As a main component, the target 202 includes, for example, aluminum (Al). Note that the target 202 may include titanium, molybdenum, silicon, or tungsten as a main component instead of aluminum.

In the present embodiment, the metal oxide layer 150 is formed by reactive sputtering using, as the target 202, the second metal whose bond dissociation energy with oxygen is higher than that of the first metal included in the oxide semiconductor layer 120. More specifically, metal atoms (more specifically, Al) ejected from the target 202 react with the reactive gas and a metal oxide is deposited on the substrate 201 by introducing oxygen ($O_2$) as a reactive gas and forming plasma 203 above the target 202.

Here, as illustrated in FIG. 8A, reactive sputtering is performed while the substrate 201 and the target 202 are disposed offset from one another. In contrast to standard reactive sputtering where the substrate 201 and the target 202 are disposed opposite one another, as illustrated in FIG. 8B, in the present embodiment, the substrate 201 and the target 202 are disposed horizontally offset from one another when viewed front on, as illustrated in FIG. 8A.

With this, the surface of the substrate 201 (more specifically, the surface on the oxide semiconductor layer 120a) is not directly subjected to the plasma 203. Consequently, the ratio of Al atoms ejected from the target 202 that are deposited on the substrate 201 without reacting with the oxygen gas increases. With this, in particular on the surface of the oxide semiconductor layer 120a, the concentration ratio of oxygen to Al atoms decreases. Oxygen deficiencies are generated as oxygen is drawn from the oxide semiconductor layer 120 as a result of this aluminum rich metal oxide layer 150 coming into contact with the oxide semiconductor layer 120. In other words, the O/Al ratio in the interface layer 160 between the oxide semiconductor layer 120 and the metal oxide layer 150 is greater than the O/Al ratio In the bulk layer 155.

Note that the offset amount of the substrate 201 and the target 202 (degree of horizontal offset) may be any amount. For example, as illustrated in FIG. 8A, the substrate 201 and the target 202 can be positioned to be completely offset from one another, that is to say, positioned so as to not overlap vertically. Alternatively, the substrate 201 and the target 202 can be positioned so as to partially overlap vertically.

Figure 8B:
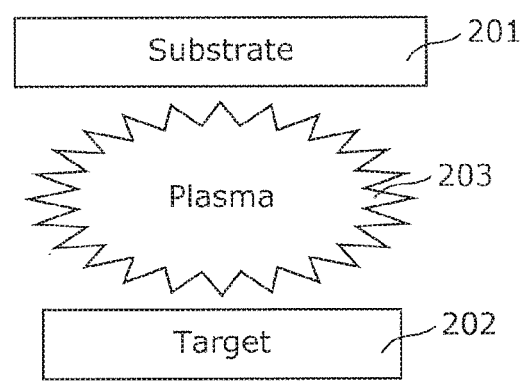
FIG. 8B illustrates the positioning of a substrate and a target in standard reactive sputtering.

Alternatively, the metal oxide layer 150 can be formed with the standard positioning illustrated in FIG. 8B. In this case, the electrical density of the sputtering may be lowered below a predetermined value. For example, it is possible to form the metal oxide layer 150 capable of reducing the resistance of the oxide semiconductor by performing reactive sputtering at an electrical density of 0.7 W/cm² or less.

(6. Advantageous Effects, etc.)

Figure 9:
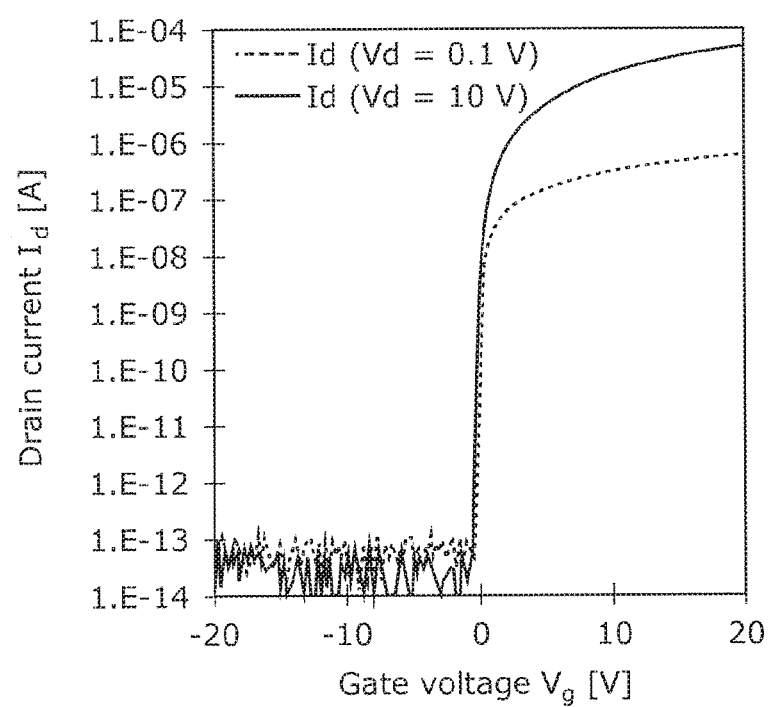
FIG. 9 illustrates current-voltage characteristics of a thin-film transistor according to an embodiment.

Next, TFT characteristics of a thin-film transistor 100 physically fabricated based on the above-described method of fabrication will be described with reference to FIG. 9. FIG. 9 illustrates the current-voltage characteristics of the thin-film transistor 100 according to the present embodiment.

When the drain voltage Vd is 0.1 V and 10 V, in either case, drain current Id sharply rises when the gate voltage Vg is around 0 V. Moreover, the ONN/OFF ratio, which is the difference between the ON current value and the OFF current value, is also sufficiently large. This shows that the thin-film transistor 100 according to the present embodiment is capable of achieving favorable TFT characteristics.

As described above, the thin-film transistor 100 according to the present embodiment includes: an oxide semiconductor layer 120 having a channel region 121, a source region 122, and a drain region 123, the source region 122 and the drain region 123 each having a resistivity lower than a resistivity of the channel region 121; a gate insulating layer 130 disposed above the oxide semiconductor layer 120; a gate electrode 140 disposed at a position that is above the gate insulating layer 130 and opposing the channel region 121; and a metal oxide layer 150 disposed on the oxide semiconductor layer 120 and in contact with the source region 122 and the drain region 123. The metal oxide layer 150 includes, as a main component, an oxide of a second metal whose bond dissociation energy with oxygen is greater than a bond dissociation energy with oxygen of a first metal included in the oxide semiconductor layer 120. A first concentration ratio of oxygen to the second metal in an interface layer 160 between the metal oxide layer 150 and the oxide semiconductor layer 120 is greater than a second concentration ratio of oxygen to the second metal in a bulk layer 155 of the metal oxide layer 150.

With this, since the bond dissociation energy with oxygen of the second metal is higher than the bond dissociation energy with oxygen of the first metal, when the metal oxide layer 150 and the oxide semiconductor layer 120 are in contact, the oxygen included in the oxide semiconductor layer 120 is drawn out by the metal oxide layer 150. As such, oxygen deficiencies generate in the source region 122 and the drain region 123 of the oxide semiconductor layer 120 in contact with the metal oxide layer 150, and the resistance of the source region 122 and the drain region 123 can be reduced. Thus, parasitic capacitance between (i) the gate electrode 140 and (ii) the source region 122 and the drain region 123 can be reduced. Moreover, the parasitic resistance from the source region 122 and the drain region 123 to the channel region 121 can be reduced, and even better transistor characteristics can be achieved.

Moreover, the method of fabrication of the thin-film transistor 100 according to the present embodiment includes: forming an oxide semiconductor layer 120 above a flexible substrate 110; forming a gate insulating layer 130 above the oxide semiconductor layer 120; forming a gate electrode 140 above the gate insulating layer 130; and forming a metal oxide layer 150 on the oxide semiconductor layer 120 by reactive sputtering to reduce a resistance of the oxide semiconductor layer 120 in a region in contact with the metal oxide layer 150.

According to research by the Inventors of the present invention, much more reliable TFT characteristics of the thin-film transistor 100 can be achieved.

Note that reliability of the TFT characteristics can be verified by performing a bias temperature stress test. A bias temperature stress test is a test that measures the amount of change between TFT threshold values before and after a predetermined voltage is applied between the gate and source. Bias temperature stress tests include a positive bias temperature stress (PBTS) test where a positive voltage is applied between the gate and source, and a negative bias temperature stress (NBTS) test where a negative voltage is applied between the gate and source.

The Inventors of the present invention applied voltage of ±20 V between the gate and source for 2000 seconds at a temperature of 90° C. When annealing was not performed, the absolute value of the TFT threshold shift amount was 5 V or more, but when annealing was performed for one hour at 350° C., the absolute value of the TFT threshold shift amount was reduced to 0.5 V or less.

By using reactive sputtering, fabrication productivity can be increased and a high quality metal oxide layer 150 can be formed.

Here, for example, the metal oxide layer 150 may be formed by forming and subsequently oxidizing a thin metal film, rather than by reactive sputtering. For example, in PTL 2, the metal oxide film is formed by oxidizing a super thin metal film, but if the amount of oxidation is insufficient, there is concern that the drain current may leak to the gate electrode via the unoxidized metal portion.

In particular, when a large substrate is used, a thin metal film having uniform in-plane properties such as the film thickness and film properties does not necessarily need to be formed. For example, when the film thickness is formed in a large region, there is concern that the thin metal film will not sufficiently oxidize whereby a region having electrical conductivity will remain. If the gate electrode 140 and the oxide semiconductor layer 120 were to conduct electricity, the TFT would no longer function as such.

Moreover, by forming the thin metal film to have a film thickness of less than 10 nm, the thin metal film can be sufficiently oxidized. However, since the film thickness is too thin in this case, when the in-plane film thickness is not even, an extremely thin region forms, and there is concern that the resistance of the oxide semiconductor layer 120 cannot be reduced.

For example, in PTL 2, although the results of the bias temperature stress test are favorable, formation of a super thin metal film on the semiconductor layer is required. As such, for example, film formation on a large substrate used in a manufacturing process of a display was found to be difficult.

Moreover, PTL 1 discloses that by exposing the offset region to plasma, the resistance of the semiconductor in the offset region can easily be reduced. However, as a result of research by the Inventors of the present invention, the plasma was found to damage the semiconductor, and as a result, in a bias temperature stress test (test in which voltage is applied at a high temperature), there was a problem that the TFT threshold voltage greatly shifted.

In view of these problems, according to the present embodiment, by, for example, forming the metal oxide layer 150 by reactive sputtering, a metal oxide layer 150 of a sufficient film thickness (more specifically 10 nm or higher, preferably 20 nm or higher) can be formed. In other words, since a process for oxidizing the thin metal film is not performed, there is no restriction on the film thickness. Consequently, there is no need for a provision for staving conductivity (leakage) between the gate electrode 140 and the oxide semiconductor layer 120.

Other Embodiments

One or more aspect of the thin-film transistor, method of fabricating thin-film transistor, and display device according has hereinbefore been described based on the above embodiment, but the present invention is not limited to this embodiment. As long as they do not depart from the essence of the present invention, various modifications to the present embodiment which may be conceived by those skilled in the art, as well as embodiments resulting from arbitrary combinations of constituent elements of different exemplary embodiments are intended to be included within the scope of the present invention.

For example, in the above embodiment, the channel region 121, the source region 122 and the drain region 123, the gate insulating layer 130 and the gate electrode 140 are formed in a self-aligned fashion, but this example is not limiting. Each may be formed in a different process using an independent mask.

Moreover, for example, in the above embodiment, as an oxide semiconductor used in the oxide semiconductor layer, an IGZO transparent amorphous oxide semiconductor is used, but this example is not limiting; for example, a polycrystalline oxide semiconductor such as IGO (In—Ga—O) may be used.

Moreover, for example, in the above embodiment, the oxide semiconductor layer 120 is given as an example of the channel layer of the thin-film transistor 100, but this example is not limiting.

Moreover, with each of the above embodiments, various modifications, permutations, additions and omissions are possible within the scope of the appended claims and equivalents.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The thin-film transistor according to the present invention can be widely used in a variety of electrical equipment, such as display devices like television sets, personal computers, cellular phones, or solid-state imaging devices like digital cameras.

What is claimed is:

1. A method of fabricating a thin-film transistor, the method comprising:
    forming an oxide semiconductor layer above a substrate;
    forming a gate insulating layer above the oxide semiconductor layer;
    forming a gate electrode above the gate insulating layer; and
    forming a metal oxide layer on the oxide semiconductor layer by reactive sputtering using, as a target, a second metal whose bond dissociation energy with oxygen is greater than a bond dissociation energy with oxygen of a first metal included in the oxide semiconductor layer to reduce a resistance of the oxide semiconductor layer in a region in contact with the metal oxide layer,
    wherein a first concentration ratio of oxygen to the second metal in an interface layer between the metal oxide layer and the oxide semiconductor layer is greater than a second concentration ratio of oxygen to the second metal in a bulk layer of the metal oxide layer, and
    wherein the first concentration ratio of oxygen to the second metal increases with progression in a depthwise direction of the interface layer.

2. The method according to claim 1, wherein
    in the forming of the metal oxide layer, the reactive sputtering is performed while the substrate and the target are offset from one another.

3. The method according to claim 1, wherein the second metal is aluminum, and the first concentration ratio is 60% or less.

4. The method according to claim 1, wherein the metal oxide layer has a film thickness of 10 nm or more.

5. The method according to claim 1, wherein the second metal is aluminum, and the metal oxide layer has a film density of 2.7 g/cm$^3$ or less.

6. A method of fabricating a thin-film transistor, the method comprising:
    forming an oxide semiconductor layer above a substrate;
    forming a gate insulating layer above the oxide semiconductor layer;

exposing the oxide semiconductor layer and forming a gate electrode above the gate insulating layer; and forming, by reactive sputtering using, as a target, a second metal whose bond dissociation energy with oxygen is greater than a bond dissociation energy with oxygen of a first metal included in the oxide semiconductor layer, a metal oxide layer in direct contact with an exposed portion of the oxide semiconductor layer, wherein a first concentration ratio of oxygen to the second metal in an interface layer between the metal oxide layer and the oxide semiconductor layer is greater than a second concentration ratio of oxygen to the second metal in a bulk layer of the metal oxide layer, and wherein the first concentration ratio of oxygen to the second metal increases with progression in a depth-wise direction of the interface layer.

7. The method according to claim 6, wherein in the forming of the metal oxide layer, the metal oxide layer covers a top surface and a side surface of the gate electrode, a side surface of the gate insulating layer, a top surface of a source region of the oxide semiconductor layer, and a top surface of a drain region of the oxide semiconductor layer.

8. The method according to claim 6, wherein the metal oxide layer is formed by an oxide of aluminum, titanium, molybdenum, or tungsten.

9. The method according to claim 6, wherein the second metal is aluminum, and the first concentration ratio is 60% or less.

10. The method according to claim 6, wherein the metal oxide layer has a film thickness of 10 nm or more.

11. The method according to claim 6, wherein the second metal is aluminum, and the metal oxide layer has a film density of 2.7 g/cm$^3$ or less.

12. A method of fabricating a thin-film transistor, the method comprising:

forming an oxide semiconductor layer above a substrate;

forming a gate insulating layer above the oxide semiconductor layer;

exposing the oxide semiconductor layer and forming a gate electrode above the gate insulating layer; and forming, by utilizing metal atoms ejected from a target by reactive sputtering with introduction of oxygen as a reactive gas, a metal oxide layer in direct contact with an exposed portion of the oxide semiconductor layer.

13. The method according to claim 12, wherein in the forming of the metal oxide layer, the metal oxide layer is formed by the reactive sputtering using, as a target, a second metal whose bond dissociation energy with oxygen is greater than a bond dissociation energy with oxygen of a first metal included in the oxide semiconductor layer, a first concentration ratio of oxygen to the second metal in an interface layer between the metal oxide layer and the oxide semiconductor layer is greater than a second concentration ratio of oxygen to the second metal in a bulk layer of the metal oxide layer, and the first concentration ratio of oxygen to the second metal increases with progression in a depth-wise direction of the interface layer.

14. The method according to claim 12, wherein the second metal is aluminum, and the first concentration ratio is 60% or less.

15. The method according to claim 12, wherein the metal oxide layer has a film thickness of 10 nm or more.

16. The method according to claim 12, wherein the second metal is aluminum, and the metal oxide layer has a film density of 2.7 g/cm$^3$ or less.

* * * * *